United States Patent
Liang et al.

(10) Patent No.: US 9,991,202 B2
(45) Date of Patent: Jun. 5, 2018

(54) METHOD TO REDUCE RESISTANCE FOR A COPPER (CU) INTERCONNECT LANDING ON MULTILAYERED METAL CONTACTS, AND SEMICONDUCTOR STRUCTURES FORMED THEREFROM

(71) Applicant: INTERNATIONAL BUSINESS MACHINES CORPORATION, Armonk, NY (US)

(72) Inventors: Jim S. Liang, Poughkeepsie, NY (US); Justin C. Long, Poughkeepsie, NY (US); Atsushi Ogino, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 17 days.

(21) Appl. No.: 14/755,440

(22) Filed: Jun. 30, 2015

(65) Prior Publication Data

US 2017/0005037 A1   Jan. 5, 2017

(51) Int. Cl.
| | |
|---|---|
| *H01L 21/76* | (2006.01) |
| *H01L 23/528* | (2006.01) |
| *H01L 21/768* | (2006.01) |
| *H01L 21/311* | (2006.01) |
| *H01L 23/522* | (2006.01) |
| *H01L 23/532* | (2006.01) |

(52) U.S. Cl.
CPC .... *H01L 23/5283* (2013.01); *H01L 21/31144* (2013.01); *H01L 21/7688* (2013.01); *H01L 21/76804* (2013.01); *H01L 21/76819* (2013.01); *H01L 21/76831* (2013.01); *H01L 21/76879* (2013.01); *H01L 23/5226* (2013.01); *H01L 23/53238* (2013.01)

(58) Field of Classification Search
CPC ....... H01L 2924/00; H01L 2924/00014; H01L 2924/01015; H01L 21/76805; H01L 21/76877; H01L 21/76831; H01L 21/76898; H01L 21/76843; H01L 21/76816; H01L 21/28282; H01L 21/31111; H01L 21/76802; H01L 21/76895; H01L 21/76897; H01L 21/0217; H01L 21/28
USPC .......... 438/631, 622, 637, 210, 628
See application file for complete search history.

(56) References Cited

U.S. PATENT DOCUMENTS

| | | | | |
|---|---|---|---|---|
| 5,358,901 | A * | 10/1994 | Fiordalice ......... | H01L 21/32051 257/763 |
| 2008/0088022 | A1* | 4/2008 | Dumas .............. | H01L 21/76841 257/751 |
| 2008/0206986 | A1* | 8/2008 | Preusse ............. | H01L 21/76805 438/653 |

\* cited by examiner

*Primary Examiner* — Brett Feeney
*Assistant Examiner* — Rodolfo D. Fortich
(74) *Attorney, Agent, or Firm* — Scully Scott Murphy and Presser; Frank Digiglio

(57) ABSTRACT

A method of forming a semiconductor structure includes forming a first insulating layer containing a first metal layer embedded therein and on a surface of a semiconductor substrate. The method further includes forming an interlayer dielectric (ILD) layer on the first insulating layer, and forming at least one via trench structure including a first metallization trench and a via in the ILD layer. In addition, the method also includes depositing a metal material to form a first metallization layer in the first metallization trench, a via contact in the via, and a second metal layer on top of at least a portion of the first metal layer in the opening of the first insulating layer. The first metal layer and the second metal layer constitute a multilayer metal contact located in the opening of the first insulating layer.

18 Claims, 13 Drawing Sheets

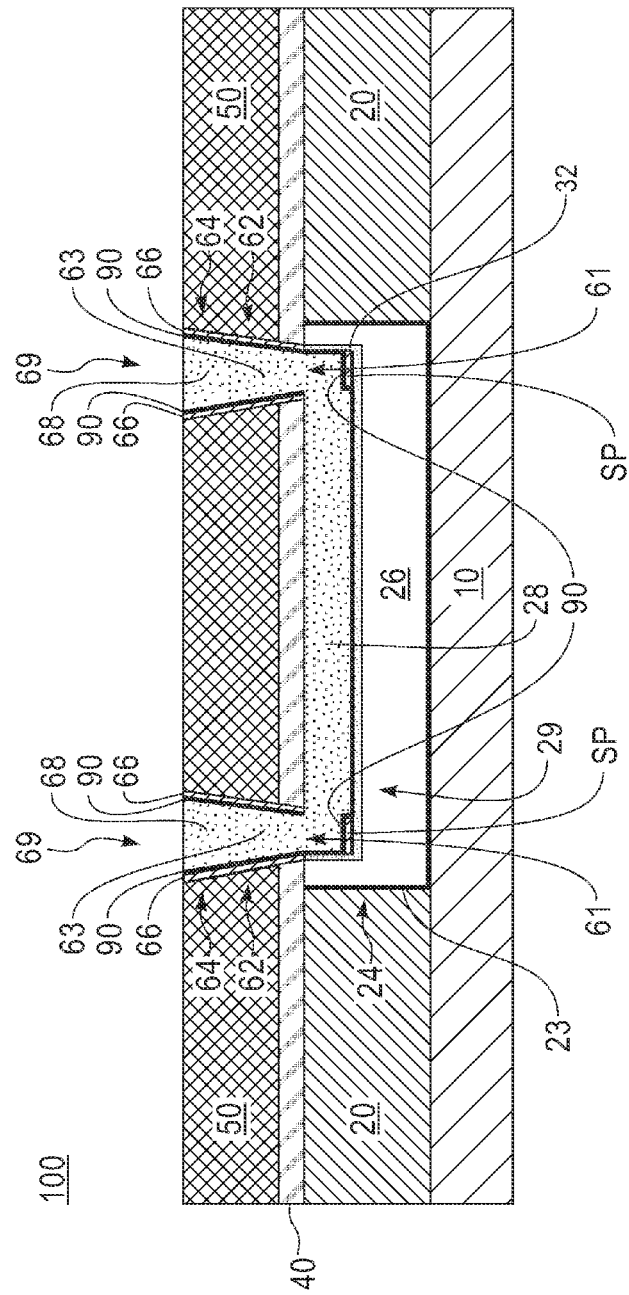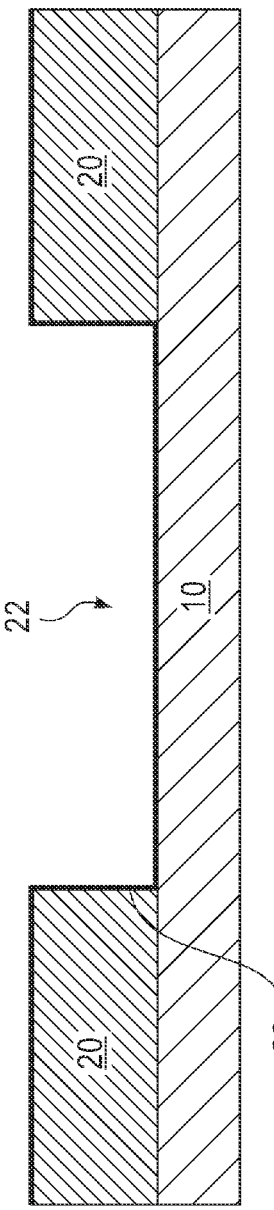

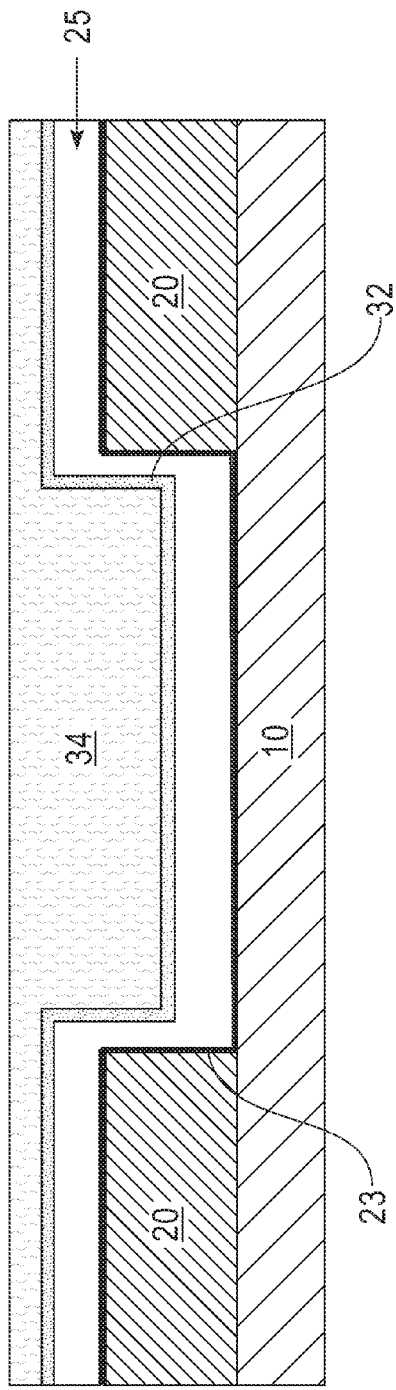
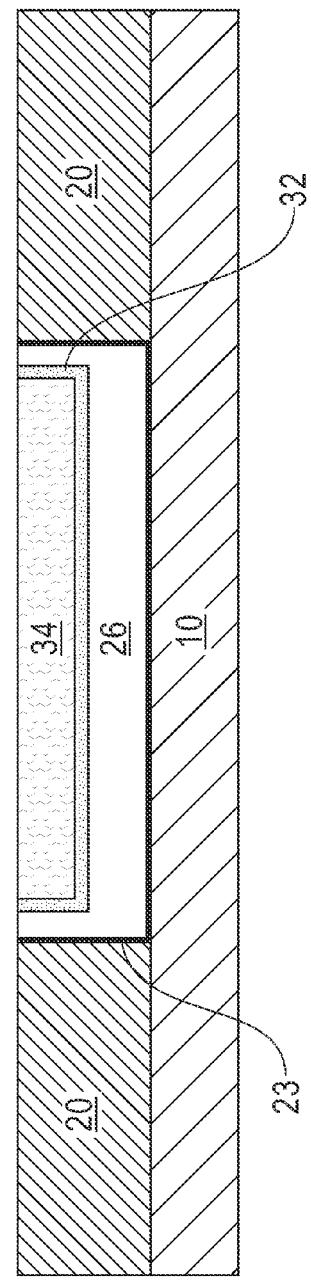
FIG. 5
FIG. 6

METHOD TO REDUCE RESISTANCE FOR A COPPER (CU) INTERCONNECT LANDING ON MULTILAYERED METAL CONTACTS, AND SEMICONDUCTOR STRUCTURES FORMED THEREFROM

BACKGROUND

The present application relates to methods for reducing the contact resistance in semiconductor structures, and particularly to methods for reducing the resistance for a copper interconnect landing on middle-of-the-line (MOL) contacts having a multilayered structure (e.g., bilayer), and to semiconductor structures manufactured therefrom.

Semiconductor structures manufactured using conventional methods in the art may have difficulties with providing a low resistance via contact to a back-end-of-the-line (BEOL) interconnect structure. In addition, semiconductor structures manufactured by conventional processes may also have difficulties in providing an MOL contact which has lower lateral resistance across the MOL contact and an MOL contact which provides lower vertical resistance down to semiconductor devices located in and/or on the semiconductor substrate.

For instance, a conventional BEOL module has challenges in meeting demanding product electrical specifications which may require reduced overall resistance of the MOL contact to the first conductive via (V0) to the first metallization layer (M1). One of the major contributors to high resistance is the via contact resistance. Traditional V0M1 integration involving copper (Cu) vias and a tantalum nitride (TaN)/tantalum (Ta) liner landing on tungsten (W) contacts has difficulties overcoming the high resistivity of the thin TaN/Ta bilayer film at the bottom of the via of the BEOL interconnect.

Other liner options used in the conventional art, such as cobalt, rather than TaN/Ta, may actually increase the via contact resistance. Further, other conventional integration schemes place a liner at an interface between the Cu via and the MOL contact, which can lead to higher via contact resistance and reduced performance of the semiconductor structure.

In addition, some methods in the conventional art used for forming the MOL contacts employ tungsten. However, tungsten may have limitations on the lateral resistance of the MOL contact. Other methods used in the conventional art which attempt to reduce the MOL lateral resistance by forming MOL contacts having a metal bilayer structure still fail to adequately reduce the lateral resistance of the MOL contact because in these conventional fabrication methods, the MOL contact and the BEOL modules are manufactured separately, which in turn leads to a liner being formed at the entire interface between the MOL contact and the via contact of the BEOL interconnect and another liner being formed at the entire interface between the metal layers of the bilayer metal MOL contact. The liner formed at the entire interface between the metal layers of the bilayer metal MOL contact may lead to higher lateral resistance across the MOL contact, and the liner formed along the entire interface between the MOL contact and the via contact may in turn lead to higher via contact resistance and reduced performance for the semiconductor structure.

SUMMARY

In accordance with an exemplary embodiment of the present application, a method of forming a semiconductor structure is provided. The method includes forming a first insulating layer containing a first metal layer embedded therein and on a surface of a semiconductor substrate. The method further includes forming an inter-layer dielectric (ILD) layer on the first insulating layer, and forming at least one via trench structure in the ILD layer, wherein the at least one via trench includes a first metallization trench and a via. In addition, the method also includes depositing a metal material on the ILD layer to form a first metallization layer including a first portion of the metal material in the first metallization trench, a via contact including a second portion of the metal material in the via, and a second metal layer including a third portion of the metal material on top of at least a portion of the first metal layer in the opening of the first insulating layer. The first metal layer and the second metal layer constitute a multilayer metal contact located in the opening of the first insulating layer.

In accordance with another exemplary embodiment of the present application, a method for forming a semiconductor device is provided. The method includes forming a-middle-of-the-line (MOL) dielectric layer on a portion of a semiconductor substrate that includes semiconductor devices, forming an opening in the MOL dielectric layer that exposes a portion of the semiconductor substrate that includes the semiconductor devices and forming an MOL liner on inner sidewalls of the MOL dielectric layer in the opening and on the portion of the semiconductor substrate exposed by the opening in the MOL dielectric layer. The method further includes forming a first metal material layer conformally along the MOL liner to partially fill the opening in the MOL dielectric layer, and forming a second metal material layer on the first metal material layer to fill the opening in the MOL dielectric layer. In addition, the method further includes performing a planarization process on the MOL dielectric layer, the MOL liner, the first metal material layer, and the second metal material layer such that upper surfaces of the MOL dielectric layer, the MOL liner, a first metal layer formed from the planarizing of the first metal material layer, and the second metal material layer are now all coplanar with each other, and performing a back end of line process (BEOL) on the planarized MOL dielectric layer.

The BEOL process of the method of the another embodiment includes depositing a low-k dielectric inter-layer dielectric (ILD layer) over the planarized MOL dielectric layer, etching the low-k ILD layer to form a plurality of via trench structures in the low-k ILD layer, in which each of the via trench structures includes a first metallization trench and a via, and removing the second metal material layer to form an upper channel passageway in the opening of the MOL dielectric layer on top of at least a portion of the first metal layer. In addition, the BEOL process of the another embodiment further includes forming an MOL contact and a plurality of via trench metallization structures by forming a copper layer from deposited copper in the upper channel passageway in the opening of the MOL dielectric layer and in the via and the first metallization trench of the via trench structures, thereby forming a second metal layer including a first portion of the copper in the upper channel passageway on top of the at least the portion of the first metal layer, a first metallization layer including a second portion of the copper in the first metallization trenches and a via contact including a third portion of the copper in the vias. The first metal layer and second metal layer constitute the MOL contact and wherein the first metal layer includes a different metal than copper.

In accordance with yet another exemplary embodiment of the present application, a semiconductor structure is provided. The semiconductor structure includes a semiconductor substrate including a plurality of semiconductor devices associated therewith, a first insulating layer located on the semiconductor substrate that includes an opening therein which exposes a portion of the semiconductor substrate including the semiconductor devices, and a multilayered metal contact located within the opening in the first insulating layer. The multilayered metal contact includes a first metal layer, and a second metal layer disposed above at least a portion of the first metal layer. The semiconductor structure further includes an inter-layer dielectric (ILD) layer located on the first insulating layer, and at least one via trench metallization structure located in ILD layer. The at least one via trench metallization structure includes a first metallization trench including a first metallization layer therein, and a via including a via contact therein. The via of the at least one via trench metallization structure extends completely through the ILD layer, and the via contact contacts the multilayered metal contact located within the opening of the first insulating layer. In addition, there is no liner at an interface between the multilayered metal contact and the via of the at least one via trench metallization structure.

BRIEF DESCRIPTION OF SEVERAL VIEWS OF THE DRAWINGS

FIG. 1 is a vertical cross-sectional view of a semiconductor structure including a plurality of via trench metallization structures according to a first embodiment of the present application.

FIG. 2 is a vertical cross-sectional view of an exemplary semiconductor structure including a middle of the line (MOL) layer having an opening therein formed on a semiconductor substrate and a MOL liner disposed along upper surfaces of the MOL layer and inner sidewalls of the MOL layer within the opening of the MOL layer.

FIG. 5 is a vertical cross-sectional view of the exemplary semiconductor structure of FIG. 4 after growing the second metal material layer on the first copper seed layer in the opening of the MOL layer and on upper surfaces of the first copper seed layer outside of the opening in the MOL layer.

FIG. 6 is a vertical cross-sectional view of the exemplary semiconductor structure of FIG. 5 after performing a chemical mechanical polishing (CMP) process to planarize the MOL layer, the MOL liner, the first metal material layer, the first copper seed layer, and the second metal material layer.

DETAILED DESCRIPTION

Figure 3:
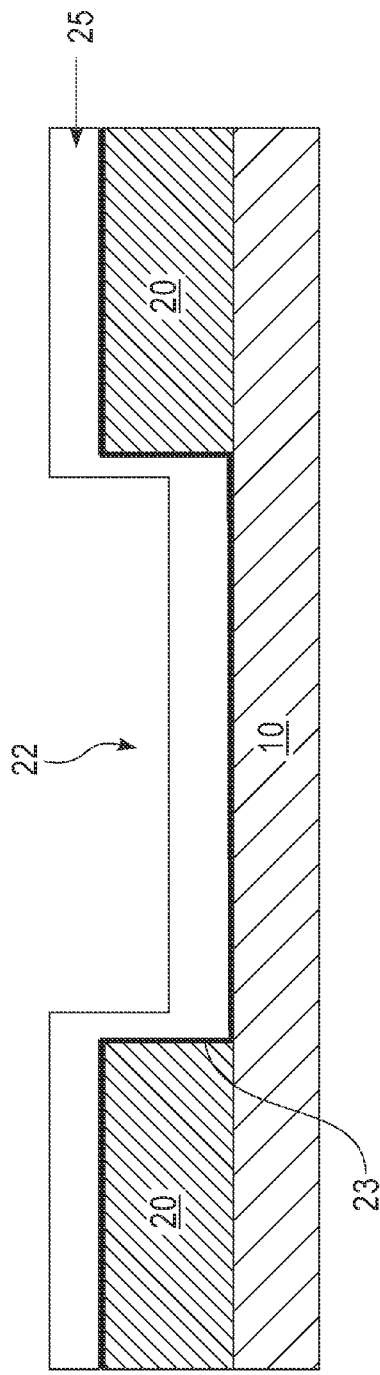
FIG. 3 is a vertical cross-sectional view of the exemplary semiconductor structure of FIG. 2 after forming a first metal material layer conformally along substantially the entire MOL liner.

Referring first to FIG. 1, there is shown a semiconductor structure 100 in accordance with a first embodiment of the present application.

The semiconductor structure 100 includes a semiconductor substrate 10. The semiconductor substrate 10 may be for example, a bulk silicon semiconductor substrate, silicon-on-insulator (SOI), or silicon-on-sapphire (SOS). Moreover, the semiconductor substrate 10 may include, for example, any semiconductor material known in the art such as, for example, silicon (Si), germanium (Ge), silicon germanium (SiGe), silicon germanium carbide (SiGeC), silicon carbide (SiC), an III-V compound semiconductor, an II-VI compound semiconductor or any combinations thereof. In addition, the semiconductor substrate 10 may include any number of active and/or passive semiconductor devices (or regions) associated therewith that may be located within the semiconductor substrate 10 or on a surface thereof and which may be formed by, for example, conventional front end of the line (FEOL) processes known in the art. In some embodiments, the semiconductor substrate 10 includes, for example, fin-shaped field effect transistors (FinFet) semiconductor devices which are typically formed by patterning an upper portion of the semiconductor substrate 10, but exemplary embodiments are not limited thereto. In an embodiment, the semiconductor devices (e.g., FinFet) associated with the semiconductor substrate 10 may be, for example, surrounded by oxides.

In addition, the semiconductor structure 100 further includes a middle of the line (MOL) layer 20 disposed on the semiconductor substrate 10. The MOL layer 20 may be a single layer or a multilayer structure. The MOL layer 20 may include, for example, an atomic layer deposition (ALD) oxide, a high density plasma (HDP) oxide, a low k dielectric material, a spin on dielectric, a chemical vapor deposition (CVD) oxide (e.g., tetraethyl orthosilicate (TEOS) oxide or a plasma enhanced-TEOS). In some embodiments, the MOL layer 20 may be a multilayer stack including various combinations of an oxide and a nitride. For example, in some embodiments, the MOL layer 20 may include an alternating stack of an oxide, a nitride, and an oxide. In other embodiments, the MOL layer 20 may include an alternating stack of an oxide, a nitride, an oxide and a nitride.

Moreover, the MOL layer 20 further includes an opening 22 therein (formed by the process discussed in connection with the method of forming the semiconductor structure 100 shown in FIGS. 2-10) that is filled with an MOL liner 23, a first copper seed layer 32, a second copper seed layer 90 and an MOL contact 24 as discussed in further detail hereinafter. The MOL liner 23 is disposed in the opening 22 in the MOL layer 20, and the MOL liner 23 covers and contacts inner sidewalls of the MOL layer 20 and an upper surface of the semiconductor substrate 10 including a region of the semiconductor substrate 10 having active devices (e.g., FinFet devices) formed therein or thereon.

In some embodiments, the MOL liner 23 may be, for example, a bilayer structure (e.g., a bottom layer/a top layer) of Ti (titanium)/TiN (titanium nitride), Ti (titanium)/tantalum nitride (TaN), Ni (nickel)/TaN (tantalum nitride), or Co (cobalt)/tantalum nitride (TaN), but exemplary embodiments are not limited thereto. In the present embodiment, the MOL liner 23 includes Ti (bottom layer)/TiN (top layer). In other embodiments, the MOL liner 23 includes Ti (bottom layer)/TaN (top layer). In still other embodiments, the bottom layer of the MOL liner 23 includes one of, for example, Ni or Co and the top layer of the MOL liner 23 includes TiN. Moreover, in other embodiments, the MOL liner 23 may be, for example, a trilayer structure (e.g. bottom layer/middle layer/top layer) of Ti, Ni, or Co as the bottom layer, TaN as the middle layer, and Ta as the top layer, or Ta as the middle layer and TaN as the top layer.

In the present embodiment, the MOL contact 24 includes, for example, a bilayer structure including a first metal layer 26 and a second metal layer 28. The MOL contact 24 is located on the MOL liner 23 within the opening 22 in the MOL layer 20. Furthermore, in the present embodiment, a first copper seed layer 32 and a second copper seed layer 90 are located in between the first metal layer 26 and the second metal layer 28 of the MOL contact 24. In other words, the MOL contact 24 (e.g., first metal layer 26 and the second metal layer 28), the first copper seed layer 32 and the second copper seed layer 90 together fill a remaining portion of the opening 22 in the MOL layer, not filled by MOL liner 23, as explained in further detail hereinafter.

In some embodiments of the present embodiment, the first metal layer 26 of the MOL contact 24 is disposed conformally along the MOL liner 23 in the opening 22 in MOL layer 20. The first copper seed layer 32 is disposed conformally along the first metal layer 26 of the MOL contact 24 in the opening 22 of the MOL layer opening 20, and the second copper seed layer 90 is located on the first copper seed layer 32 of the MOL contact 24 in the opening 22 of the MOL layer 20. Further, the second metal layer 28 of the MOL contact 24 is disposed on the stack of the second copper seed layer 90 and the first copper seed layer 32 mentioned above, and the second metal layer 28 of the MOL contact 24 also fills a recess (e.g., an upper channel passageway 80 formed in the method illustrated in FIG. 8) that is located above a portion of the first metal layer 26 of the MOL contact 24 in the opening 22 of the MOL layer 20. Moreover, upper portions of the first metal layer 26 laterally surround the second metal layer 28 such that the MOL contact 24 in the present embodiment has, for example, a U-shaped appearance. However, the MOL contact 24 of exemplary embodiments of the present application is not limited to any particular shape.

In addition, the upper surface of the MOL liner 23, the upper surface of the MOL layer 20, the upper surface of the first copper seed layer 32, and the upper surface of the MOL contact 24 are all coplanar with each other. Also, the bottom surface of the second metal layer 28 is vertically offset from, and located above, the bottom surface of the first metal layer 26 of the MOL contact 24.

In some embodiments, the MOL contact 24 is, for example, a bilayer structure in which the second metal layer 28 of the MOL contact 24 may include copper (Cu), and the first metal layer 26 of the MOL contact 24 may include one of cobalt (Co), tungsten (W), nickel (Ni), gold (Au), or silver (Ag). In the present embodiment, the MOL contact 24 includes a bilayer structure of Co (first metal layer 26)/Cu (second metal layer 28).

Alternatively, and in other embodiments, the MOL contact 24 may instead include, for example, a trilayer structure in which copper is a top layer of the trilayer structure, and any one of cobalt, nickel, gold, silver or tungsten is included in middle and bottom layers of the trilayer structure.

In addition, the semiconductor structure 100 further includes, a low-k barrier layer 40 and an inter-layer dielectric (ILD) layer 50 (e.g., a low k-ILD layer 50 in the present embodiment) sequentially stacked on an upper surface of the MOL layer 20 and on the upper surface of the MOL contact 24 including on the upper surfaces of the first metal layer 26 and the second metal layer 28 of the MOL contact 24. The low-k barrier layer 40 may include, for example, a low-k oxide, a silicon nitride (SiN), a silicon carbide (SiC), a nitrogen doped silicon carbide (SiCN), a carbon doped silicon nitride (SiCN), or an ALD nitride. The low-k barrier layer 40 may provide electrical isolation between metal lines (e.g., copper metallization layers) formed in back-end-of-the-line (BEOL) processes discussed hereinafter. A low-k dielectric is defined herein as having a dielectric constant of no greater than 7.

Alternatively, and in other embodiments, the low-k barrier layer 40 may be omitted. The low-k barrier layer 40 may be formed to a thickness of, for example, from 0 nm-50 nm.

The low-k ILD layer 50 may be formed of low-k dielectric materials such as, for example, Black Diamond™ commercially available from Applied Materials, Inc., of Santa Clara, Calif., Silk™ commercially available from Applied Materials, Inc., of Santa Clara, Calif., a fluorine doped oxide, or an ultra-low k dielectric material. The low-k ILD layer 50 may have a thickness of, for example, 50 nm-200 nm. For example, in embodiments in which the Low-k barrier layer 40 is omitted then a thicker ILD layer 50 including for example, a low-k oxide may be formed instead of the low-k barrier layer 40.

In addition, the semiconductor structure 100 further includes a plurality of via trench metallization structures 69 located in the low-k ILD layer 50 and the low-k barrier layer 40. The via trench metallization structures 69 each include a via 62 and a first metallization trench 64. The first metallization trench 64 is located in an upper portion of the low-k ILD layer 50, and the via 62 is located in a lower portion of the low-k ILD layer 50 and the via 62 also extends through the entire low-k barrier layer 40.

As discussed in further detail in the method for forming the semiconductor structure 100 illustrated in FIGS. 2-10, the via trench metallization structures 69 may be formed, for example, in a BEOL process using a conventional dual damascene process performed on the low-k ILD layer 50 and the low-k barrier layer 40. The first metallization trench 64 of each of the via trench metallization structures 69 include a back end liner 66 located on inner sidewalls of the first metallization trench 64, and a second copper seed layer 90 located on the back end liner 66 on the inner sidewalls of the first metallization trench 64. In addition, the first metallization trench 64 of the via trench metallization structures 69 further include a first metallization layer 68 (e.g., copper layer) disposed therein which fills the remaining portion of the first metallization trench 64 that is not filled by the back end liner 66 and the second copper seed layer 90.

In addition, the via 62 of each of the via trench metallization structures 69 may also include, the back end liner 66 on inner sidewalls thereof, and the second copper seed layer 90 located on the back end liner 66 on the inner sidewalls of the via 62. Also, the via 62 of the via trench structures 60 may further include a via contact 63 therein formed of a metal layer (e.g., copper layer) filling a remaining portion of the via 62 not filled by the second seed layer 90 and the back end liner 66.

In some embodiments, the back end liner 66 may be a bilayer structure including, for example, TaN (bottom of bilayer)/Ta (top of bilayer), TaN (bottom of bilayer)/Co (top of bilayer), Ta (bottom of bilayer)/Co (top of bilayer), or Ti (bottom of bilayer)/TiN (top of bilayer). In other embodiments, the back end liner 66 may be a trilayer structure including, for example, Ta (bottom of trilayer)/TaN (middle of trilayer)/Co (top of trilayer) or TaN (bottom of trilayer)/Ta (middle of trilayer)/Co (top of trilayer). In other embodiments, the back end liner 66 may be a single layer structure including, for example, CuMnO. Typically, the back end liner 66 is a bilayer structure including, for example, TaN (bottom layer of bilayer)/Ta (top layer of bilayer). The back end liner 66 may have a thickness of, for example, 2 nm to 10 nm.

Further, as shown in FIG. 1, a small portion SP of the back end liner 66 may be located on portions of the first copper seed layer 32 at an interface 29 that is between the first metal layer 26 and the second metal layer 28 of the MOL contact 24. This may be result of some of the back liner 66 dripping down into the opening 22 of the MOL layer 20 and onto portions of the first copper seed layer 32 located directly under the via trench metallization structures 60 during the formation of the back end liner 66 in the first metallization trench 64 and via 62 of the via trench metallization structures 69, as explained in further detail hereinafter in connection with the methods for forming the semiconductor structure 100 of the first embodiment of the present application illustrated in FIGS. 2-10. Some of the second seed layer 90 may also be located over the small portion SP of the back end liner 66 located on portions of the first copper seed layer 32 at the interface 29 between the first metal layer 26 and the second metal layer 28 of the MOL contact 24. The interface 29 is defined herein as the entire area in between the first metal layer 26 and the second metal layer of the MOL contact 24.

The small portion SP of the back end liner 66 may be, for example, about the same width as the width of the openings of the bottom of the vias 62 of the via trench metallization structures 69. In some embodiments, the small portion SP of the back end liner 66 may have a width of, for example, 20 nm-100 nm.

As can be seen from the above, there is essentially no liner at the interface 29 between the first metal layer 26 and the second metal layer of the MOL contact 24, except for only a small amount of liner (e.g., small portion SP of back end liner 66) located on portions of the first copper seed layer 32 at the interface 29 between the first metal layer 26 and the second metal layer 28 of the MOL contact 24. This small amount of liner (e.g., small portion SP of back end liner 66) has no appreciable negative effect on the resistance of the MOL contact 24. By having no more than only a small amount of liner at the interface 29 between the first metal layer 26 and the second metal layer 28, the structure of the MOL contact 24 of this embodiment of the present application allows for the MOL contact 24 to provide a lower vertical resistance down to semiconductor devices associated with the semiconductor substrate 10. In contrast, conventional MOL contacts, which have a liner along the entire interface between metal layers of the MOL contact, provide a higher vertical resistance down to the semiconductor devices.

Further, in the present embodiment, the first metallization layer 68 that is located in the first metallization trench 64 of the via trench metallization structure 69 and the via contact 63 in the via 62 of the via trench metallization structure 69 may each include, for example, a copper layer. In the present embodiment, the back end liner 66, the second copper seed layer 90 and the copper layer in both the first metallization trench 64 and the via 62 may each be formed, for example, during a same BEOL process as discussed in further detail hereinafter in connection with FIGS. 2-10.

The via contacts 63 of the via trench metallization structures 69 contact the MOL contact 24 in MOL layer 20. Also, in the present embodiment, the upper surface of the first metallization layer 68 in the first metallization trench 64 of the via trench metallization structure 69 is co-planar with an upper surface of the low-k ILD layer 50.

However, as seen in FIG. 1 of the present embodiment, a liner is not located at the interface 61 between the MOL contact 24 and the vias 62 of the via trench metallization structures 69. Rather, in the present embodiment, the back end liner 66 is located only on the inner sidewalls of first metallization trench 64 and the via 62 of the via trench metallization structures 69 as mentioned above. The interface 61 between the MOL contact and the via 62 is defined herein as a horizontal plane between the bottom of the low-k barrier layer 40 to the top of the MOL contact 24. In embodiments in which the low-k barrier layer 40 is omitted, then the interface 61 between the MOL contact 24 and the via 62 would instead be defined as a horizontal plane between the bottom of the low-k ILD layer 50 to the top of the MOL contact 24.

As there is no liner at the interface between the MOL contact 24 and the vias 62 of the via trench metallization structures 69 in the present embodiment, the semiconductor structure 100 of the present embodiment may prevent the difficulties encountered in the conventional art in connection with high via contact resistance which occurs due to convention fabrication methods forming a liner at the entire interface between an MOL contact and the via of a BEOL interconnect structure.

Reference is now made to FIGS. 2-10, which illustrate a method for fabricating the semiconductor structure 100 shown in FIG. 1 according to the first embodiment of the present application. Specifically, and referring to FIG. 2, a semiconductor substrate 10 as defined above is provided.

Next, conventional FEOL processes known in the art may be performed to form any number of active and/or passive semiconductor devices (or regions) within the semiconductor substrate 10 or on a surface thereof. For example, and in some embodiments, fin-shaped field effect transistors (FinFet) semiconductor devices including a plurality of semiconductor fins may be formed, but exemplary embodiments are not limited thereto.

Further, an MOL layer 20 is then disposed on the semiconductor substrate 10 including on a region of the semiconductor substrate 10 having the semiconductor devices (e.g. FinFet device) formed by a conventional FEOL process. The MOL layer 20, as defined above, may be deposited by, for example, a CVD process or by a combination of an ALD process and a CVD process.

Next, as shown in FIG. 2, an opening 22 is formed in the MOL layer 20 by, for example, an anisotrophic dry etching process (e.g., reactive ion etching (RIE), which may expose the semiconductor devices (not shown) formed in and/or on the semiconductor substrate 10. Further, a MOL liner 23 is then deposited conformally along the top surfaces of the MOL layer 20 and within the opening 22 of the MOL layer 20 on the inner sidewalls of the MOL layer 20, and along the exposed area of the semiconductor substrate 10 including on the semiconductor devices. The MOL liner 23, as defined above, may be deposited by, for example, a CVD or a physical vapor deposition (PVD) process. The thickness of the MOL liner 23 may be, for example, from 5 nm-20 nm.

Next, as shown in FIG. 3, a first metal material layer 25, for forming the first metal layer 26 (See, e.g., FIG. 1) of the MOL contact 24 (See, e.g., FIG. 1) is deposited conformally along the MOL liner 23 on upper surfaces of the MOL layer 20 and within the opening 22 of the MOL layer 20. The first metal material layer 25 may include, for example, one of cobalt, nickel, silver, gold, or tungsten. In the present embodiment, the first metal material layer 25 includes cobalt. The first metal material layer 25 may be deposited onto the MOL liner 23 by, for example, a CVD or a PVD process. In some embodiments, the first metal material layer 25 may be deposited on the MOL liner 23 to, for example, a thickness that is approximately half the thickness of the MOL layer 20, but exemplary embodiments are not limited thereto. Rather, the thickness of the first metal material layer 25 may be varied as desired for a particular application.

Figure 4:
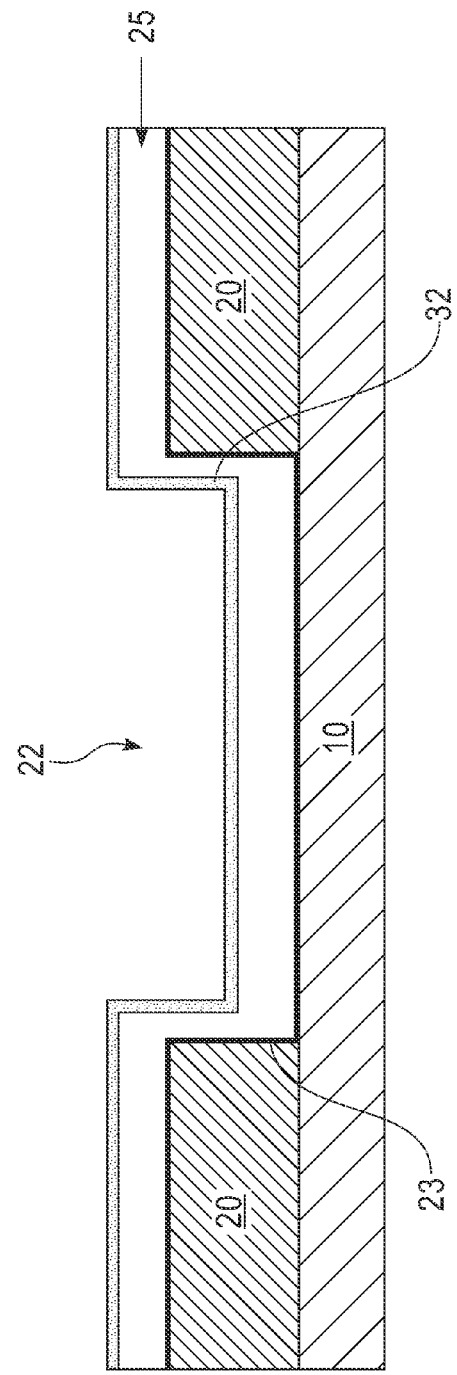
FIG. 4 is a vertical cross-sectional view of the exemplary semiconductor structure of FIG. 3 after forming a first copper seed layer conformally along the first metal material layer.

Further as shown in FIG. 4, a first seed layer 32 (e.g., a first copper seed layer 32 in the present embodiment) is then deposited, for example, conformally along the first metal material layer 25 on upper surfaces of the MOL layer 20 and within the opening 22 in the MOL layer 20. The first copper seed layer 32 may be deposited by, for example, a PVD or a CVD process, and the thickness of the first copper seed layer 32 may be, for example, from 10 nm to 30 nm. In some embodiments, the first copper seed layer 32 may be additionally doped with materials such as, for example, aluminum (Al) and/or manganese (Mn).

Alternatively, and in other embodiments, the first copper seed layer 32 may be omitted. For instance, in embodiments in which CVD copper deposition is used in the BEOL processes described hereinafter instead of copper plating for metallization, then the first copper seed layer 32 may be omitted. In still other embodiments, the first copper seed layer 32 may still be used even when using CVD copper deposition for metallization.

Moreover, in the present embodiment, as shown in FIG. 5, a second metal material layer or sacrificial metal layer 34 which may include one of tungsten (W), Ti or TiN is grown on the first copper seed layer 32 using, for example, a CVD or a PVD process. Typically, the second metal material layer 34 includes tungsten. The second metal material layer 34 fills the remaining portion of the opening 22 in the MOL layer 20 that is not filled by the MOL liner 23, the first metal material layer 25 and the first copper seed layer 32. In addition, as shown in FIG. 5, the second metal material layer 34 may also be overgrown onto the upper surfaces of MOL layer 20 outside the opening 22 in the MOL layer 20.

Referring now to FIG. 6, the second metal material layer 34, the first copper seed layer 32, the first metal material layer 25 and the MOL liner 23 are each planarized using, for example, a chemical mechanical polishing (CMP) process, such that the upper surfaces of the second metal material layer 34, the first copper seed layer 32, the first metal material layer 25 (now referred to hereinafter as the first metal layer 26 for the MOL contact 24) and the MOL liner 23 are all coplanar with each other. In others words, after the CMP planarization process, the planarized first metal material layer 25 is now referred to hereinafter as the first metal layer 26 for the MOL contact 24. The second metal material layer 34 may serve, for example, to provide a substantially flat surface for subsequently performed BEOL processes discussed hereinafter.

Next, BEOL processes in accordance with the present embodiment are then performed. The BEOL processes in connection with the present embodiment are discussed hereinafter in connection with FIGS. 7-10.

Figure 7:
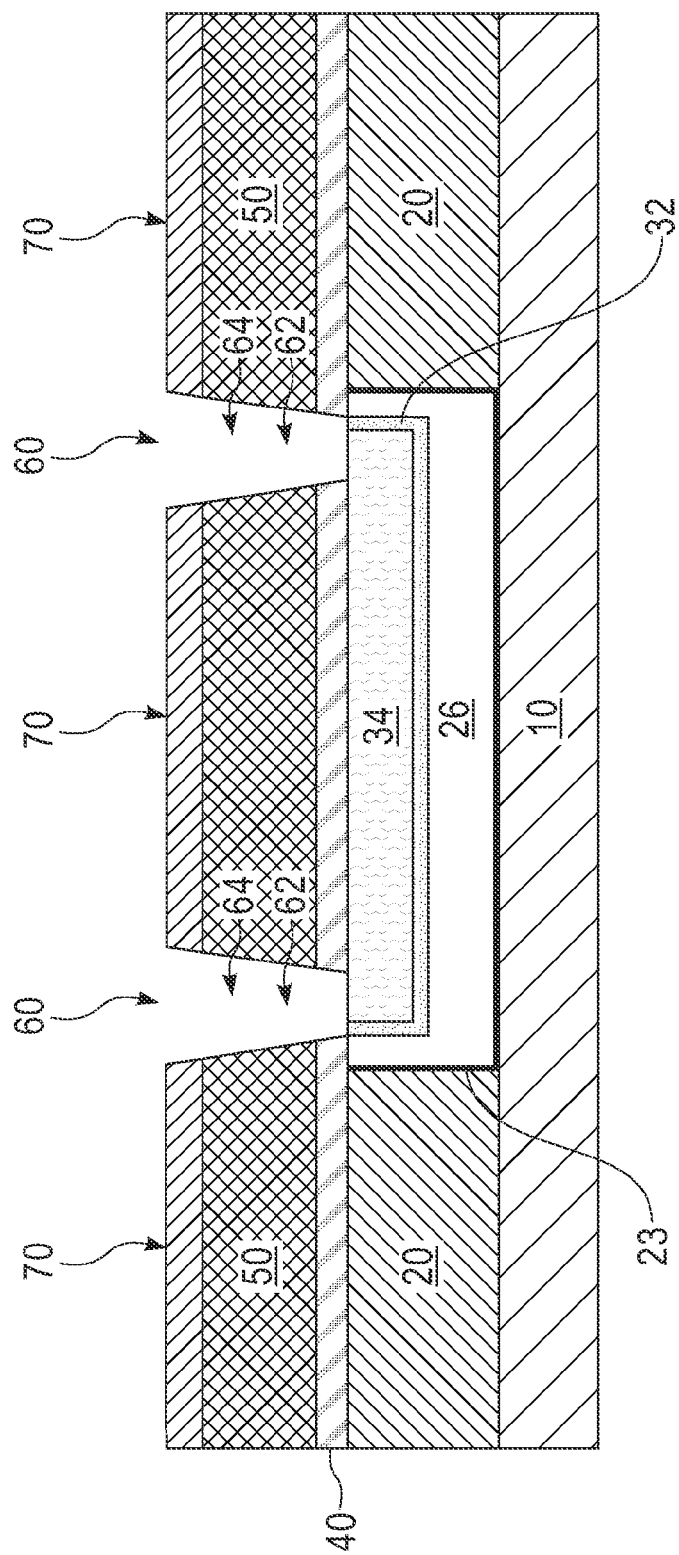
FIG. 7 is a vertical cross-sectional view of the exemplary semiconductor structure of FIG. 6 after forming sequentially forming a low-k barrier layer on the MOL layer, a low-k ILD layer on the low-k barrier layer and a hard mask layer on the low-k ILD layer, and patterning the hard mask layer and using the patterned hard mask to form a plurality of via trench structures in the low-k ILD layer and the low-k barrier layer.

In particular, referring to FIG. 7, a low-k barrier layer 40, as defined above, is then formed on the upper surface of the MOL layer 20, the upper surface of the second metal material layer 34 and on the uppermost surface of the first metal layer 26 (e.g., cobalt). Alternatively, and in other embodiments, the low-k barrier layer 40 may be omitted.

Further, in the present embodiment, a low-k ILD layer 50, as defined above, may be formed on the low-k barrier layer 40 by, for example, a CVD process. In embodiments in which the low-k barrier layer 40 is omitted, a thicker ILD layer 50 including for example, a low-k oxide may be formed instead of the Low-k barrier layer 40.

Next, a hard mask layer (not shown) is formed on the low-k ILD layer 50 by, for example, a PVD process. The hard mask layer may have a thickness of, for example, 10 nm to 35 nm. Moreover, the hard mask layer may be formed of, for example, TiN, TaN, Co, W, Ti, Ta, or WN. In the present embodiment, the hard mask layer is formed of TiN.

Further, the hard mask layer is then patterned by using, for example, conventional lithography and etching processes to form a patterned hard mask 70 on the low-k ILD layer 50 which exposes certain portions of the low-k ILD layer 50. The low-k ILD layer 50 and the low-k barrier layer 40 are then etched using the patterned hard mask 70 as an etch mask in, for example, a damascene process (e.g., a dual damascene process in the present embodiment) to form a plurality of via trench structures 60 each extending through the low-k ILD layer 50 and the low-k barrier layer 40. An anisotrophic dry etching process such as, for example, an RIE process is used to form the via trench structures 60.

Each via trench structure 60 exposes an upper portion of the second metal material layer 34 in the opening 22 of the MOL layer 20. In particular, each via trench structure 60 includes a first metallization trench 64 located in an upper portion of the low-k dielectric ILD layer 50, and a via 62 located in a lower portion of the low-k-dielectric ILD layer 50 and that extends from the lower portion of the low-k-dielectric ILD layer 50 through the entire Low-k barrier layer 40 such that a bottom opening of the via 62 exposes upper portions of the second metal material layer 34. The bottom opening of the via 62 of each of the via trench structures 60 may have a width of, for example, 20 nm-100 nm.

Figure 8:
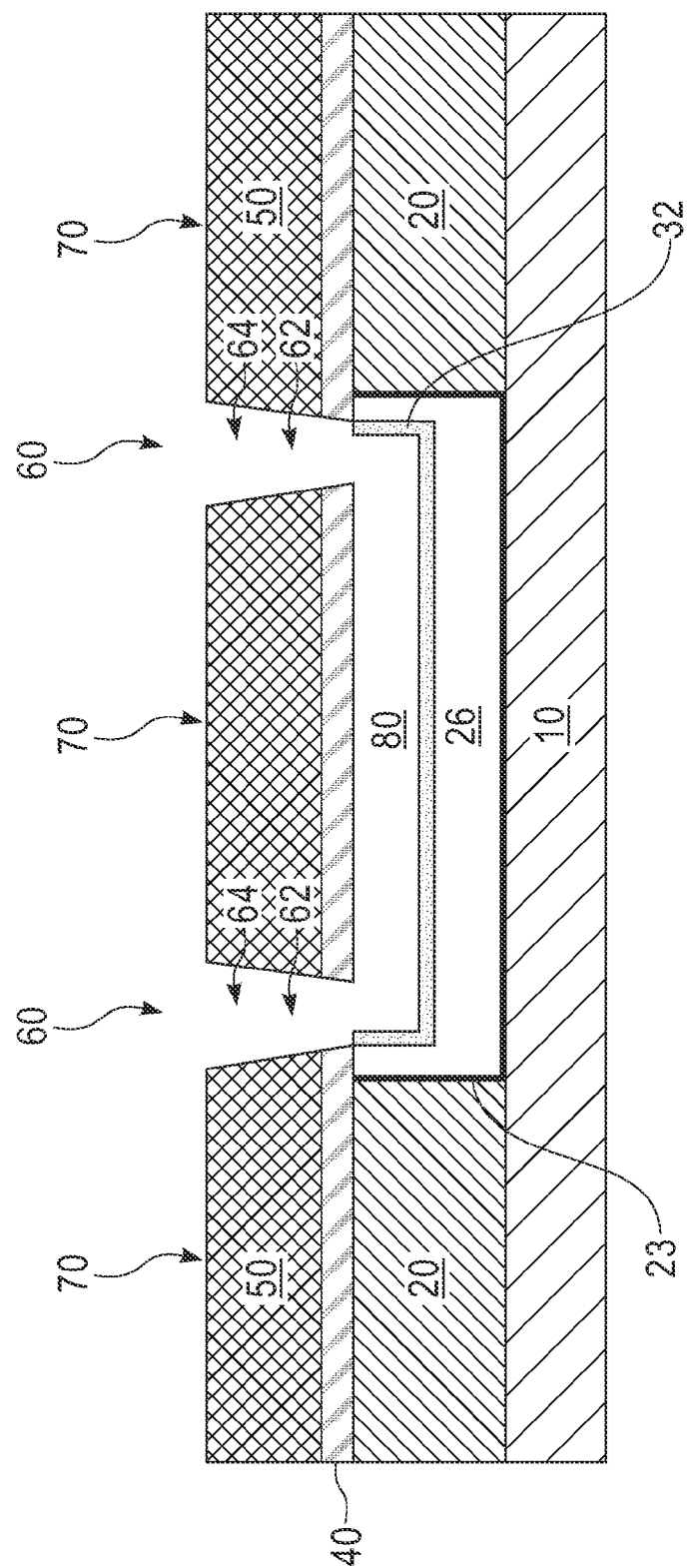
FIG. 8 is a vertical cross-sectional view of the exemplary semiconductor structure of FIG. 7 after removing the second metal material layer by an etching process to define an upper channel passageway in opening of the MOL layer.

Now referring to FIG. 8, the patterned hard mask 70 and the second metal material layer 34 are both removed using, for example, a wet etching process selective to the first copper seed layer 32, the first metal layer 26, the low-k barrier layer 40, and the low-k ILD layer 50, thereby defining an upper channel passageway 80 on the first copper seed layer 32 in the opening 22 of the MOL layer 20. The bottom openings of the vias 62 of the via trench structures 60 are each connected to openings of the upper channel passageway 80 located in the MOL layer 20.

The wet etchants which may be used to remove the patterned hard mask 70 and the second metal material layer 34 include, for example, a standard clean (SC1) solution (e.g., $NH_4OH:H_2O_2:H_2O$ mixture), or a benzotriazole (BTA)/SC1 mixture. In some embodiments, tetraethylammonium hydroxide (TEAH) or tetra-methyl ammonium hydroxide (TMAH) may replace ammonium hydroxide in the SC1 solutions. Also, by removing the patterned hard mask 70 in the present embodiment, this may prevent difficulties with the copper metallization (e.g., hollow metal defects in the metallization layers) in subsequent stages of the BEOL process discussed hereinafter.

Figure 9:
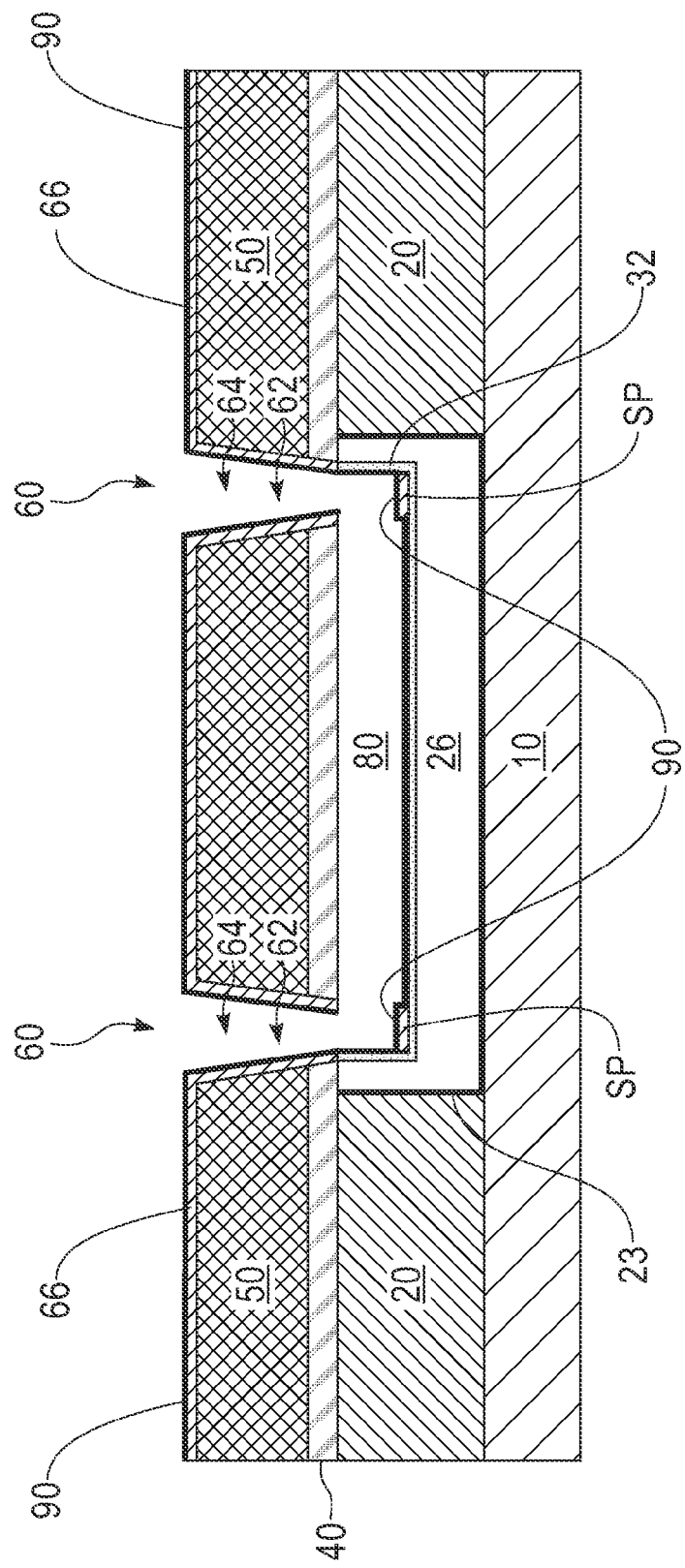
FIG. 9 is a vertical cross-sectional view of the exemplary semiconductor structure of FIG. 8 after forming a back end liner and a second copper seed layer on upper surfaces of the low-k ILD layer and on inner sidewalls of the via and the first metallization trench of the via trench structures and after forming the second copper seed layer on the first copper seed layer in the upper channel passageway.

Next, referring to FIG. 9, a back end liner 66, as defined above, is then deposited on upper surfaces of the low-k ILD layer 50, on inner sidewalls of the first metallization trench 64 and on inner sidewalls of the via 62 of each the via trench structures 60 by, for example, a PVD process. Further, as shown in FIG. 9 a small portion SP of the back end liner 66 may drip down through the via trench structures 60 into the upper channel passageway 80 in the opening 22 of the MOL layer 20 and onto portions of the first copper seed layer 32 during the formation of the back end liner 66. The small portions SP of the back end liner 66 mentioned above do not have any appreciable negative effect in connection with the contact resistance of the semiconductor structure 100. Instead, by only having a small amount of the back end liner 66 at this position contributes to the reduction of the vertical resistance of the MOL contact 24 down to the semiconductor devices associated with the semiconductor substrate 10, as explained in further detail hereinafter.

Further, a second seed layer 90 (e.g., a second copper seed layer 92 in the present embodiment) is formed on the back end liner 66 along the upper surface of the low-k ILD layer 50 and on inner sidewalls of the first metallization trench 64 of each of the via trench structures 60. The second copper seed layer 90 is also formed on the inner sidewalls of the via 62 of each of the via trench structures 60. In addition, the second copper layer 90 is also formed on the first copper seed layer 32 and over the small portions SP of the back end liner 66 located on portions of the first copper seed layer 32 in the upper channel passageway 80 in the MOL layer 20 located above a portion of the first metal layer 26. The second copper seed layer 90 may be formed by, for example, a PVD or a CVD process, and the thickness of the second copper seed layer 90 may be, for example, from 10 nm to 30 nm.

Alternatively, and in other embodiments, the second copper seed layer 90 may be omitted. For instance, in embodiments in which a CVD copper deposition method is used in later stages of the BEOL processes described hereinafter instead of copper plating method for metallization, the second copper seed layer 90 may then be omitted. In still other embodiments, the second copper seed layer 90 may be used even when using CVD copper deposition for metallization.

Figure 10:
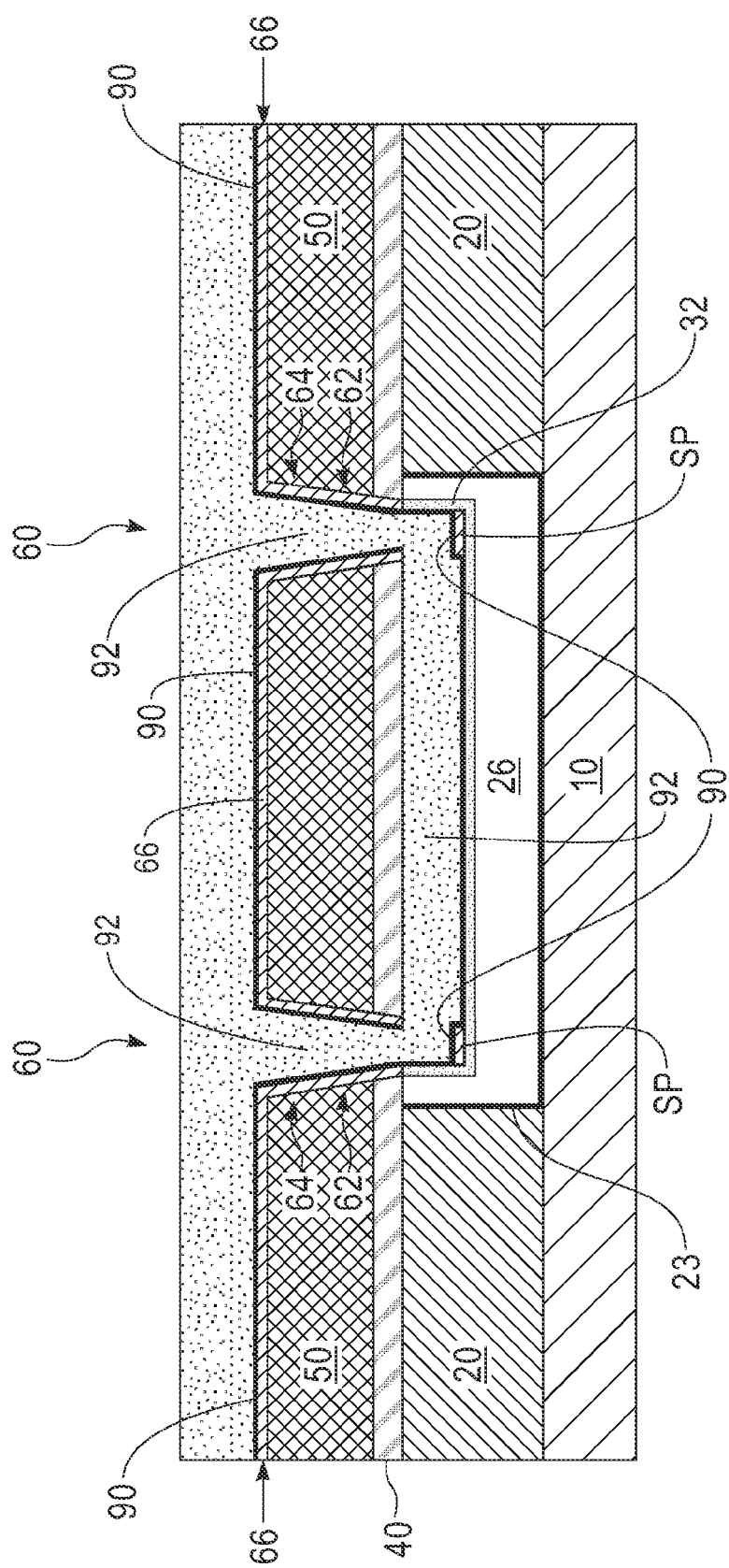
FIG. 10 is a vertical cross-sectional view of the exemplary semiconductor structure of FIG. 9 after forming a plurality of via trench metallization structures using a copper plating process.

Next, referring to FIG. 10, a metal material (e.g., copper plating material) is deposited over the structure of FIG. 9 and a metal layer 92, such as, for example, a copper layer 92 in the present embodiment is then grown from the deposited copper plating material by using the second copper seed layer 90 and the first copper seed layer 32 as templates in, for example, a copper plating method to thereby form the copper layer 92 in the each of the via trench structures 60 and in the upper channel passageway 80 located in the MOL layer 20, as is explained in further detail below.

In the present embodiment using the copper plating process, a copper plating solution (not shown) is deposited over the structure in FIG. 9, and a copper layer 92 is grown, for example, upward from the first copper seed layer 32 and the second copper seed layer 90 in the upper channel passageway 80 located in the opening 22 of the MOL layer 20 to fill the upper channel passageway 80, and the copper layer 92 is also formed in the first metallization trenches 64 by being grown, for example, sideways from the second copper seed layer 90 located on the inner sidewalls of the first metallization trenches 64 to thereby fill the first metallization trenches 64 of the via trench structures 60. Further, the copper layer 92 is also grown in the vias 62 by being grown, for example, sideways from the second copper seed layer 90 located on the inner sidewalls of the vias 62 during the copper plating process to thereby fill the vias 62. Moreover, the copper layer 92 may also be overgrown onto upper surfaces of the second copper seed layer 90 (e.g., overgrown with a thickness 500 nm to 1000 nm) outside of the via trench structures 60, and grown above the via trench structures 60.

Further, a planarization process using, for example, CMP, is then performed to planarize the excess copper layer 92 overgrown outside of the via trench structures 60, the second copper seed layer 90 and the back end liner 66. As a result of the above planarization process, a plurality of via trench metallization structures 69 are formed. The via trench metallization structures 69 each include one of the first metallization trenches 64 that is filled with the planarized back end liner 66, the planarized second copper seed layer 90 and some of the copper layer 92 (now referred to as a first metallization layer 68 including copper), and one of the vias 62 that is filled with the planarized back end liner 66, the planarized second copper seed layer 90 and with some of the copper layer 92 (now referred to as via contact 63 including copper). As a result of the above planarization process, the copper layer 92 grown to fill the upper channel passageway 80 is now referred to as the second metal layer 28 of the MOL contact 24 that is located on top of a portion the first metal layer 26 with the second copper seed layer 90 and the first copper seed layer 32 located between the first metal layer 26 and the second metal layer 28 of the MOL contact 24, thereby completing the formation of the bilayer MOL contact 24 and forming the semiconductor structure 100 illustrated in FIG. 1.

In other words, the above-mentioned BEOL process of the present embodiment is used to form the first metallization layers 68 of the via trench metallization structures 69, the via contacts 63 of the via trench metallization structures 69 and is also used to complete the other half of metal bilayer of the MOL contact 24, thereby forming the semiconductor structure 100 illustrated in FIG. 1.

As mentioned above, and in other embodiments, the MOL contact 24 may instead include, for example, a trilayer structure in which copper is the top layer of the trilayer structure, and any one of cobalt, nickel, gold, silver or tungsten is included in the middle and bottom layers of the trilayer structure.

Alternatively, and in other embodiments, a CVD copper method known in the art may be used instead of the copper plating method to grow a metal layer 92 (e.g., copper layer 92) to form the first metallization layers 68 of the via trench metallization structures 69, the via contacts 63 of the via trench metallization structures 69 and to form the other half (e.g., the second metal layer 28) of metal bilayer of the MOL contact 24.

With the above-mentioned methods of exemplary embodiments of the present application, there is no liner formed at the interface between the via of the via trench metallization structure and the MOL contact. By not forming a liner at the interface between the via of the via trench metallization structure and the MOL contact, a significant reduction in via contact resistance and an increase in performance of the semiconductor structure may be achieved. As discussed above, in conventional art methods, liners are formed at the entire interface between the MOL contact and the via of the BEOL interconnect structure which in turn may lead to a higher via contact resistance.

In addition, with exemplary embodiments of the present application, there is essentially no liner formed at the interface between the first metal layer and the second metal layer of the MOL contact with the exception of a small portion of a back end liner on portions of the interface between the first metal layer and second metal layer of the MOL contact. However, this small amount of liner may have only a minor effect on the resistance of MOL contact. On the contrary, and in comparison to conventional art fabrication methods that form a liner at the entire interface between the upper metal layer and the lower metal layer of the MOL contact, the MOL contacts formed by methods of exemplary embodiments the present application provide a significantly lower vertical resistance from the MOL contact to the semiconductors devices (e.g., FinFet devices) formed in and/or on the semiconductor substrate.

Since in exemplary embodiments, a remaining part (e.g., the second metal layer) of the MOL contact is formed in the BEOL process along with the first metallization layers and via contacts, a liner does not need to be formed at the interface between the vias of the via trench structures and the MOL contact or between the first and second metal layers of the MOL contact. In contrast, in the conventional art, the BEOL metallization processes and the formation of the MOL contact are performed separately and thus a liner is formed at the interface between the vias of the via trench structures and the MOL contact and at the interface between the first and second metal layers of the MOL contact.

Moreover, with exemplary embodiments of the present application, by forming an MOL contact having a multilayered structure (e.g., bilayer structure) in which the second metal layer (upper layer) is formed of, for example, copper and a first metal layer (e.g., bottom layer) includes one of cobalt, tungsten, nickel, silver or gold, the lateral resistance across the MOL contact may also consequently be reduced in comparison to multiplayer MOL contacts in the conventional art.

Furthermore, with exemplary embodiments of the present application, since the back end liner is not formed on the interface between the via and the MOL contact but rather the back end liner is only formed on the inner sidewalls of the via and the first metallization trench of the via trench metallization structures, a reliable and traditional back end liner including, for example, a TaN/Ta may be used in the via trench metallization structures and a lower via contact resistance may still be achieved. In contrast, in conventional V0M1 integration involving Cu vias, back end liners such as a TaN/Ta back end liner landing on MOL contacts (e.g., tungsten) may have difficulties overcoming the high resistivity of the thin TaN/Ta bilayer film at the bottom of the via.

In addition, the use of a back liner such as a TaN/Ta back liner in exemplary embodiments of the present application is beneficial over other liner options such as cobalt used in the conventional art which may actually increase contact resistance. Moreover, other alternative schemes attempted in the conventional art seeking to replace using a TaN/Ta back end liner, instead provide a liner at the interface between the Cu via of the BEOL interconnect structure and the MOL contact which as discussed above may increase the via contact resistance.

Figure 11:
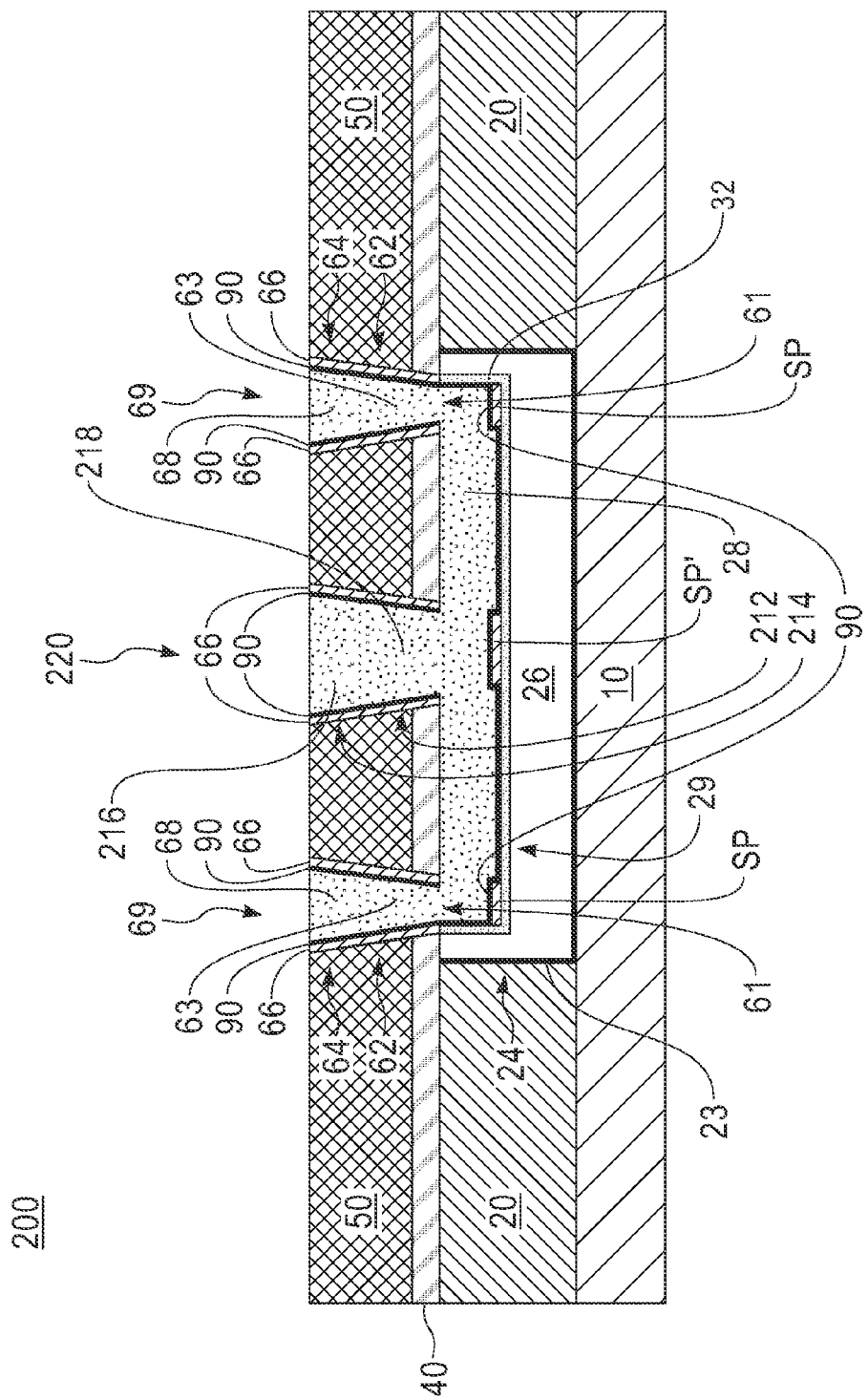
FIG. 11 is a vertical cross-sectional view of an exemplary semiconductor structure including a plurality of via trench metallization structures with a dummy via trench metallization structure located in between the plurality of via trench metallization structures according to a second embodiment of the present application.

Next, a semiconductor structure 200 in accordance with a second embodiment of the present application is illustrated in FIG. 11. The same reference numerals will be used in the present embodiment in the detailed description and the drawings to refer to the same elements in common with the first embodiment. Moreover, for the sake of brevity, elements of the first embodiment in common with the present embodiment will not be described. It is noted that the semiconductor structure 200 of the present embodiment is essentially the same as the semiconductor structure 100 of the first embodiment, except that the semiconductor structure 200 of the present embodiment further includes a dummy via metallization structure 220 which may be used to facilitate metallization during a copper plating process as explained in further detail hereinafter.

In the present embodiment as shown in FIG. 11, a dummy via trench metallization structure 220 is located in the low-k ILD layer 50 and the low-k barrier layer 40 and in between the via trench metallization structures 69. The dummy via trench metallization structure 220 may be filled with, for example, a same metal material (e.g., copper) as the via trench structures 60. The dummy via trench metallization structure 220 includes a dummy via 212 and a dummy first metallization trench 214. The dummy first metallization trench 214 of the dummy via trench metallization structure 220 is located in an upper portion of the low-k ILD layer 50, and the dummy via 212 of the dummy via trench metallization structure 220 is located in a lower portion of the low-k ILD layer 50 and extends completely through the entire Low-k barrier layer 40.

In present embodiment, the dummy first metallization trench 214 includes a back end liner 66 located on inner sidewalls thereof, and a second copper seed layer 90 located on the back end liner 66 that is on the inner sidewalls of the dummy first metallization trench 214. In addition, the dummy first metallization trench 214 further includes a dummy first metallization layer 216 (e.g., copper layer) disposed therein which fills the remaining portion of the first dummy metallization trench 214 that is not filled by the back end liner 66 and the second copper seed layer 90.

The dummy via 212 of the dummy via trench structure 220 includes the back end liner 66 on inner sidewalls thereof, and the second copper seed layer 90 located on the back end liner 66 on the inner sidewalls of the dummy via 212. Also, the dummy via 212 of the dummy via trench metallization structure 220 may include a dummy via contact 218 therein that is composed of a metal layer (e.g., copper layer) filling a remaining portion of the dummy via 212 not filled by the second seed layer 90 and the back end liner 66.

As discussed in further detail in the method for forming the semiconductor structure 200 illustrated in FIGS. 12-15, the dummy via trench metallization structure 220 and the via trench metallization structures 69 may be formed simultaneously during a same BEOL process (e.g., a conventional dual damascene process) performed on the low-k ILD layer 50 and the low-k barrier layer 40.

The dummy via contact 218 of the dummy via trench metallization structure 220 in the present embodiment is not connected to circuitry and thus the dummy via trench metallization structure 220 is not electrically active. In contrast, the via contacts 63 of the via trench metallization structures 69 in the present embodiment are connected to circuitry (not shown) and thus the via trench metallization structures 69 are electrically active. The dummy via trench metallization structure 220 is used in the present embodiment to facilitate metallization in the BEOL process such as, for example, facilitating the forming of the second metal layer 26 of the MOL contact 24 in the upper channel passageway 80 in the MOL layer 20 when using a copper plating process.

Next, a method for forming the semiconductor structure 200 of the second embodiment will now be described in detail below. Many of the same processing steps used to form the semiconductor structure 100 of the first embodiment may also be used to form the semiconductor structure 200 of the present embodiment, except that there are some additional features with the process for forming the semiconductor structure 200 of the present embodiment and therefore FIGS. 7-10 of the first embodiment are replaced by the process steps illustrated in FIGS. 12-15 in the present embodiment as explained in further detail below.

For example, the same processing steps as performed in connection with FIGS. 2-6 may be performed in the present embodiment to provide a semiconductor substrate 10 having any number of active and/or passive semiconductor devices (or regions) located within the semiconductor substrate 10 and/or on a surface thereof and which were formed by conventional FEOL processes, and an MOL layer 20 disposed on the upper surface of the semiconductor substrate 10 including on the semiconductor devices (e.g., FinFet devices) of the semiconductor substrate 10. Moreover, the same process steps as performed in connection with FIGS. 2-6 may also be performed in the present embodiment to provide an opening 22 in the MOL layer 20, and a sequential stack of the following of a MOL liner 23, a first metal material layer 25 for forming a first metal layer 26 (See, e.g., FIG. 11) of an MOL contact 24 (See, e.g., FIG. 11), a first copper seed layer 32, and a second metal material layer 34 (e.g., tungsten) inside the opening of the MOL layer 20.

Figure 12:
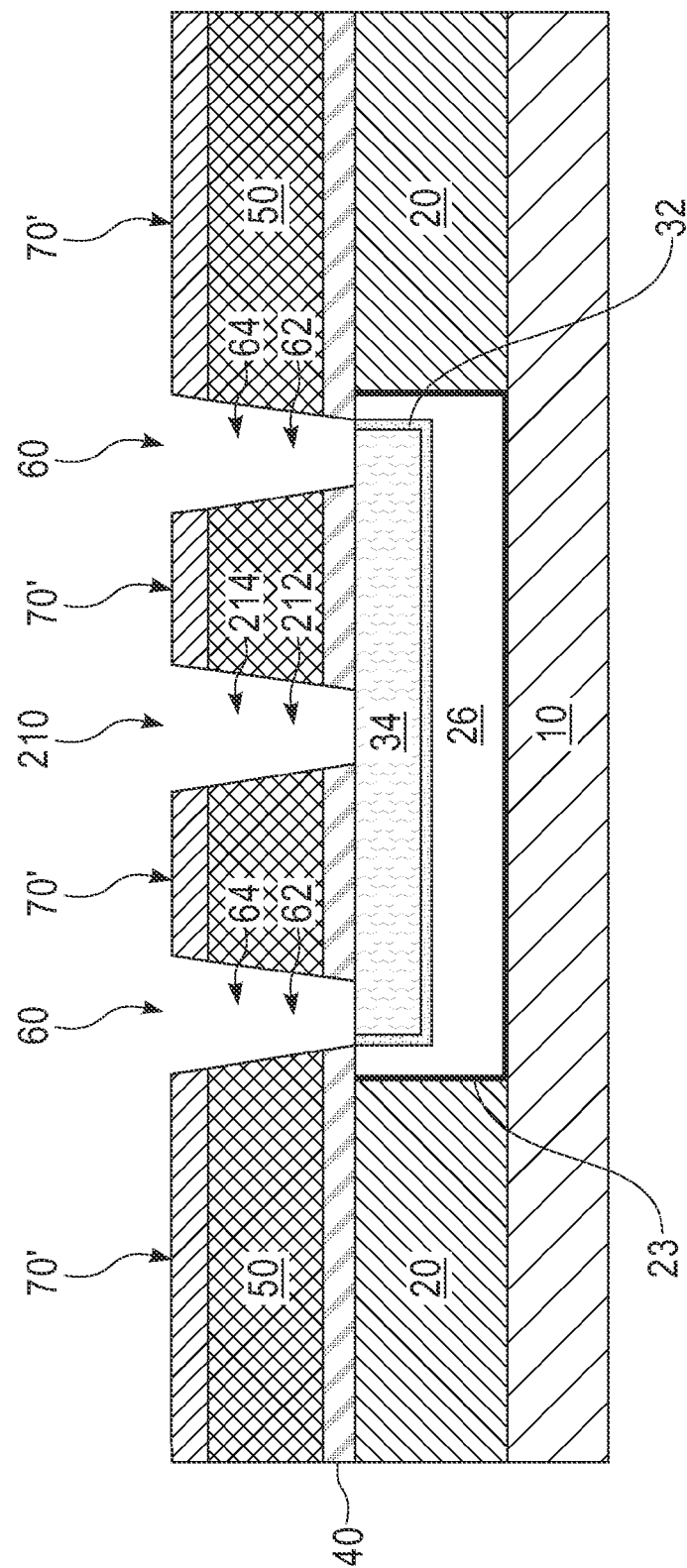
FIG. 12 is a vertical cross-sectional view of the exemplary semiconductor structure of FIG. 11 after forming sequentially forming a low-k barrier layer on the MOL layer, a low-k ILD layer on the low-k barrier layer and a hard mask layer on the low-k ILD layer, and then patterning the hard mask layer and then using the patterned hard mask to form a plurality of via trench structures in the low-k ILD layer and the low-k barrier layer and a dummy via trench structure in the low-k ILD layer and the low-k barrier layer and in between the plurality of via trench structures.

Further, referring to FIG. 12 of the present embodiment, a Low-k barrier layer 40, a low-k ILD layer 50 and a hard mask layer (not shown) may be sequentially formed on the upper surface of the MOL layer 20, the upper surface of the second metal material layer 34 (e.g., tungsten layer) and the upper surface of the first metal material layer 25 (e.g., cobalt) in the same manner as discussed in connection with the first embodiment illustrated in FIG. 7. The hard mask layer is then patterned by using, for example, conventional lithography and etching processes to form a hard mask pattern 70' on the low-k ILD layer 50 which exposes, for example, at least three regions of the low-k ILD layer 50. The low-k ILD layer 50 and the Low-k barrier layer 40 may then be etched using the patterned hard mask 70' as an etch mask, for example, in a damascene process (e.g., a dual damascene process in the present embodiment) to form a plurality of via trench structures 60 extending through the low-k ILD layer 50 and the low-k barrier layer 40 in similar fashion to the first embodiment illustrated in FIG. 7, except that in the present embodiment illustrated in FIG. 12, unlike the first embodiment of FIG. 7, a dummy via trench structure 210 is also formed in the low-k ILD layer 50 and the Low-k barrier layer 40 and in between the via trench structures 60.

In the present embodiment, the dummy via trench structure 210 is formed by using the patterned hard mask 70' in the same BEOL process (e.g., dual damascene process) used to form the via trench structures 60. The dummy via trench structure 210 includes a dummy via 212 and a dummy first metallization trench 214. The dummy first metallization trench 214 of the dummy via trench structure 210 is located in an upper portion of the low-k ILD layer 50, and the dummy via 212 of the dummy via trench structure 210 is located in a lower portion of the low-k ILD layer 50 and extends through the entire low-k barrier layer 40 to expose the upper surface of the second metal material layer 34. In some embodiments, the opening at the bottom of the via 62 of each of the via trench structures 60 has a width less than a width of the opening at the bottom of dummy via 212 of the dummy via trench structure 210. In other embodiments, the opening at the bottom of the via 62 of each of the via trench structures 60 has a width that is equal to a width of the opening at the bottom of dummy via 212 of the dummy via trench structure 210. However, exemplary embodiments of the present application are not limited to the above-mentioned widths for the openings at the bottom of the vias 62 and the opening at the bottom of the dummy via 212 but rather these widths may be varied depending upon the specific application.

Figure 13:
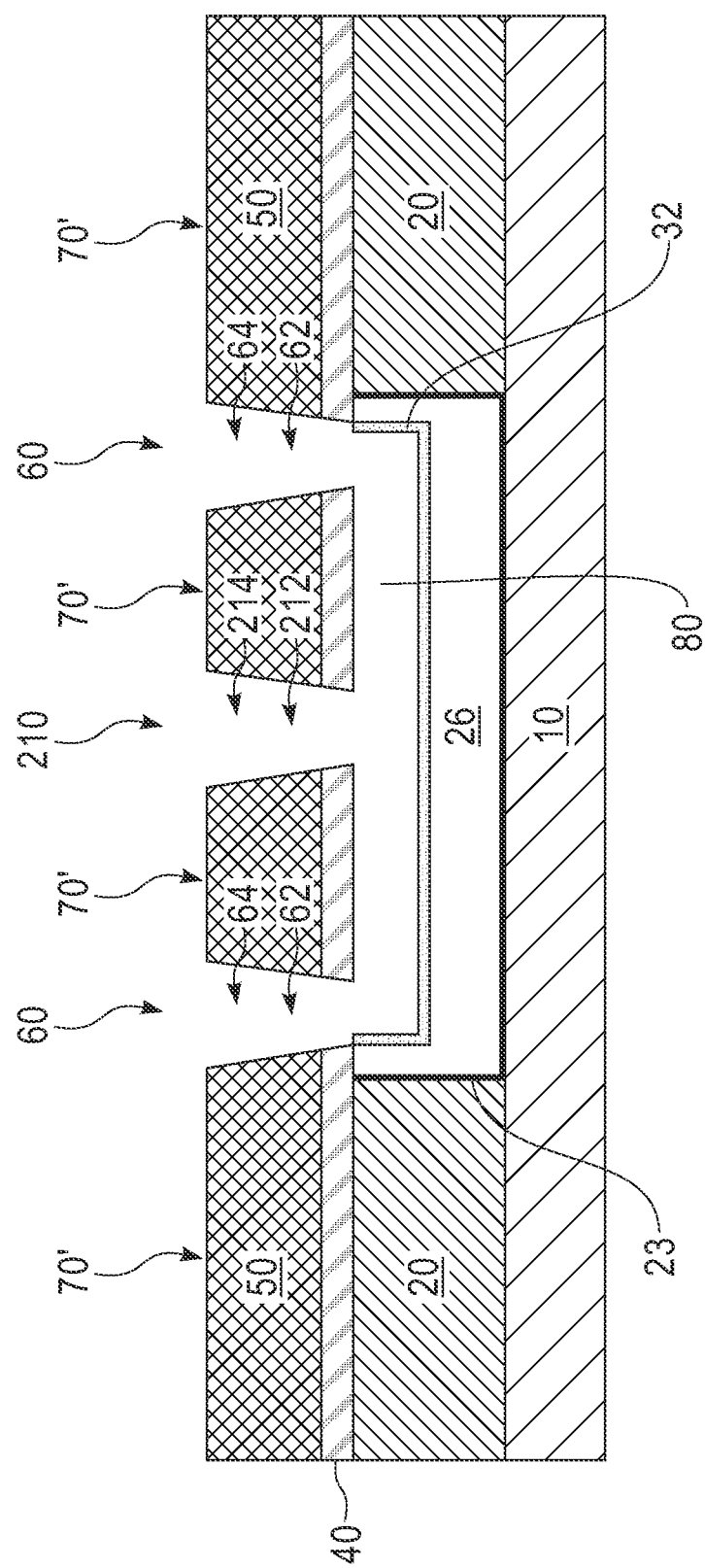
FIG. 13 is a vertical cross-sectional view of the exemplary structure of FIG. 12 after removing the second metal material layer by an etching process to define an upper channel passageway in opening of the MOL layer.

Now referring to FIG. 13, the patterned hard mask 70' and the second metal material layer 34 are removed using, for example, a wet etching process selective to the first copper seed layer 32, the first metal layer 26, the low-k barrier layer 40, and the low-k ILD layer 50, thereby defining an upper channel passageway 80 on the first copper seed layer 32 in the opening 20 of MOL layer 20. The vias 62 of the via trench structures 60 are each connected to openings of the upper channel passageway 80. Also, the dummy via 212 of the dummy via trench structure 210 is also connected to an opening of the upper channel passageway 80. In addition, the patterned hard mask 70' and the second metal material layer 34 may then be removed using the same processes (e.g., wet etching process) discussed in connection with FIG. 8 of the first embodiment.

Figure 14:
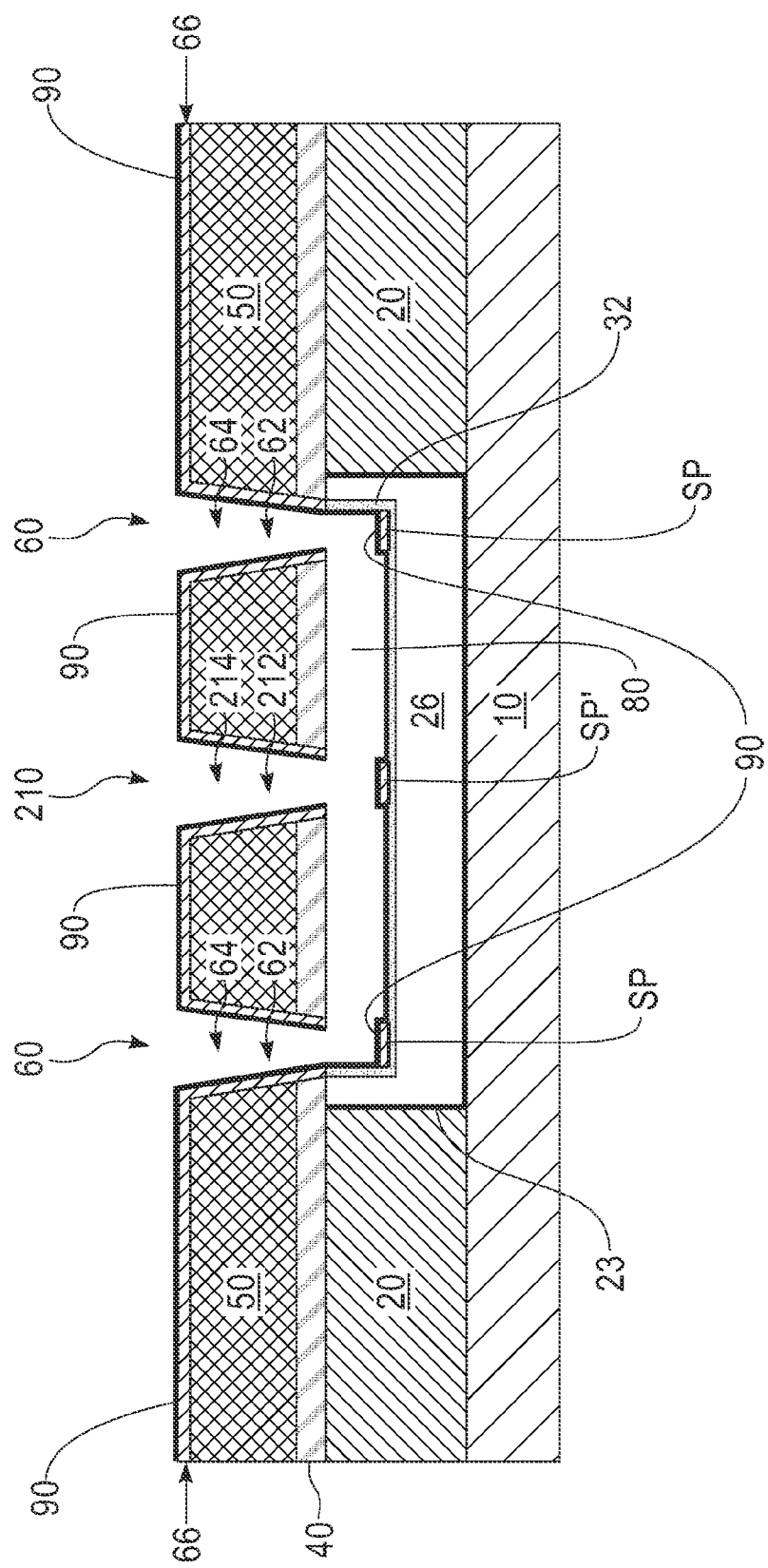
FIG. 14 is a vertical cross-sectional view of the exemplary structure of FIG. 13 after forming a back end liner and a second copper seed layer on upper surfaces of the low-k ILD layer and on inner sidewalls of the via and the first metallization trench of the via trench structures, on inner sidewalls of the dummy via and the dummy first metallization trench, and also forming the second copper seed layer on the first copper seed layer in the upper channel passageway.

Next, referring to FIG. 14, a back end liner 66 is then deposited on upper surfaces of the low-k ILD layer 50, on inner sidewalls of the first metallization trench 64, on inner sidewalls of the via 62 of the via trench structures 60, on inner sidewalls of the dummy first metallization trench 214 of the dummy via trench structure 210 and on inner sidewalls of the dummy via 212 of the dummy via trench structure 210 by, for example, a PVD process. Further, as shown in FIG. 14, a small portion SP of the back end liner 66 may drip down through the via trench structures 60 during the formation of the back end liner 66 into the upper channel passageway 80 located in the opening 22 of the MOL layer 20 and onto portions of the first copper seed layer 32 located directly underneath the via trench structures 60, and another small portion SP' of the back end liner 66 may also drip down through the dummy via trench structure 210 and onto another portion of the first copper seed layer 32 located directly underneath the dummy via trench structure 210.

The small portion SP of the back end liner 66 may be, for example, about the same width as the openings of the bottoms of each of the vias 62 of the via trench metallization structures 69 and the other small portion SP' of the back end liner 66 may be, for example, about the same width as the opening of the bottom of the dummy via 212 of the dummy via trench metallization structures 220.

Further, a second copper seed layer 90 is grown on substantially the entire back end liner 66 along the upper surface of the low-k ILD layer 50, on the inner sidewalls of the first metallization trench 64 of the via trench structures 60, on the inner sidewalls of the via 62 of the via trench structures 60, on the inner sidewalls of the dummy metallization trench 214 of the dummy via trench structure 210 and on the inner sidewalls of the dummy via 212 of the dummy via trench structure 210. In addition, the second copper layer 90 is also formed on substantially the entire first copper seed layer 32, and over the small portion SP of the back end liner 66 located on portions of the first copper seed layer 32 in the upper channel passageway 80 in the MOL layer 20 and over the other small portion SP' of the back end liner 66 located on another portion of the first copper seed layer 32 in the upper channel passageway 80 in the MOL layer 20. For example, the second copper seed layer 90 may be formed by a PVD or a CVD process, and the thickness of the second copper seed layer 90 may be from 10 nm to 30 nm.

Figure 15:
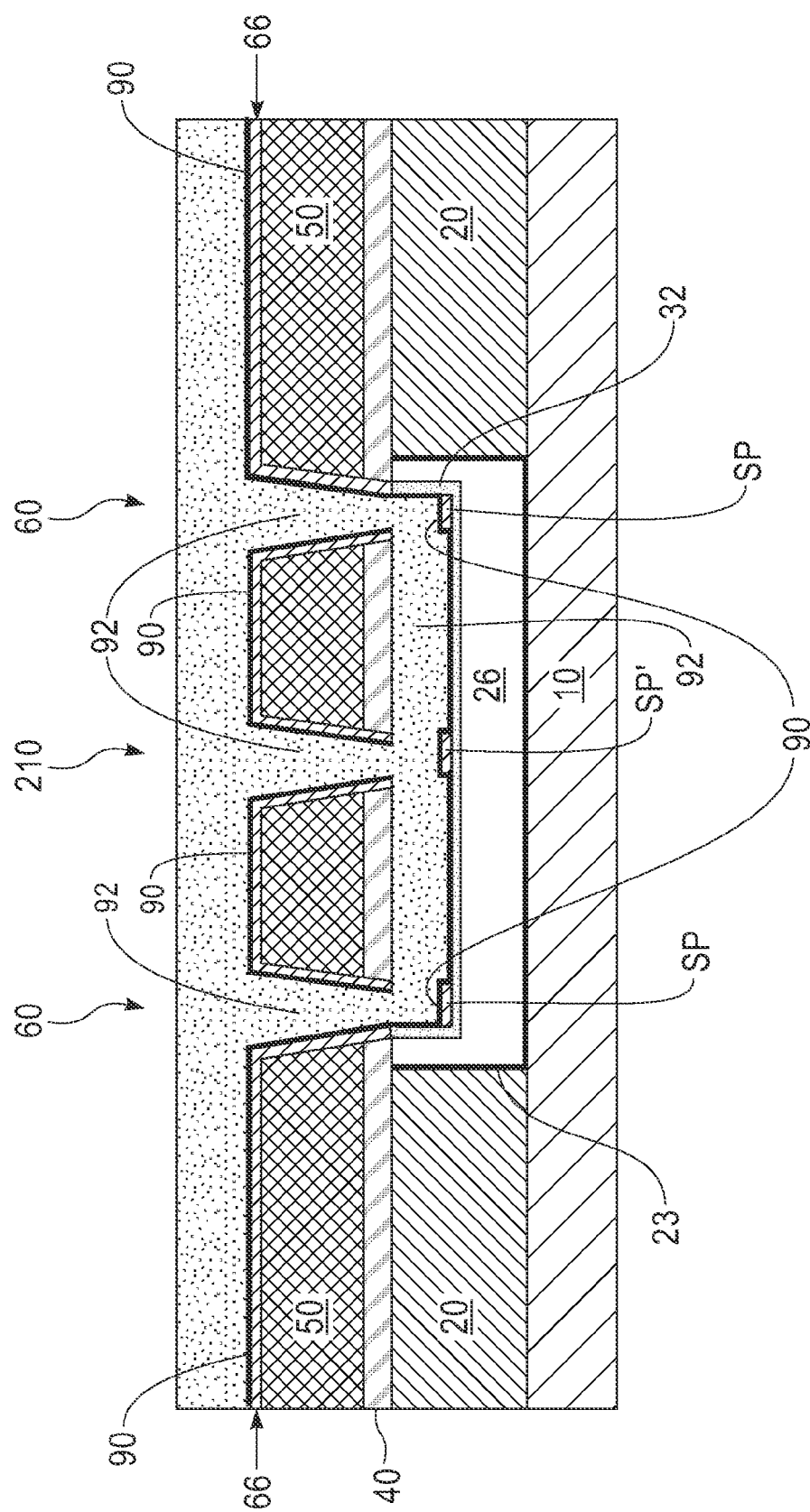
FIG. 15 is a vertical cross-sectional view of the exemplary semiconductor structure of FIG. 14 after forming a plurality of via trench metallization structures, and a dummy via trench metallization structure in between the via trench metallization structures by a copper plating process.

Next, as shown in FIG. 15, a metal material (e.g. copper material) is deposited over the structure of FIG. 14 and then a metal layer 92, such as, for example, a copper layer 92 is grown by using the second copper seed layer 90 and the first seed layer 32 as templates in, for example, a copper plating method to thereby form the copper layer 92 on the second copper seed layer 90, in the via trench structures 60, in the dummy via trench structure 210 and in the upper channel passageway 80, as is explained in further detail below.

In particular, in the present embodiment using the copper plating process, a copper plating solution (not shown) is deposited over the structure of FIG. 14, and grown, for example, upward from the first copper seed layer 32 and the second copper seed layer 92 to form a metal layer 92 (e.g., copper layer 92) that fills the upper channel passageway 80 in the opening 22 of the MOL layer 20. In addition, the copper layer 92 is also grown in the first metallization trench 64 of each of the via trench structures 60, and the via 62 of each of the via trench structures 60 by being grown, for example, sideways from the second copper seed layer 90 located on the inner sidewalls of the first metallization trenches 64 and the inner sidewalls of the vias 62, to thereby fill the first metallization trench 64 of each of the via trench structures 60 and the vias 62 of each of the via trench structures 60.

Further, the copper layer 92 is also grown in the dummy first metallization trench 214 of the dummy via trench structure 210 and in the dummy via 212 of the dummy via trench structure 210 by being grown, for example, sideways from the second copper seed layer 90 located on the inner sidewalls of the dummy first metallization trench 214 and the inner sidewalls of the dummy via 212 to thereby fill the dummy first metallization trench 214 of the dummy via trench structure 210 and the dummy via 212 of the dummy via trench structure 210. Moreover, the copper layer 92 may also be overgrown on upper surfaces of the second copper seed layer 90 (e.g., overgrown with a thickness 500 nm to 1000 nm) and also above the via trench structures 60 and the dummy via trench structure 210.

Next, a planarization process using, for example, CMP is performed to planarize the excess copper layer 92 overgrown outside of the via trench structures 60 and the dummy via trench structure 210, the second copper seed layer 90 and the back end liner 66. As a result of the above planarization process, a plurality of via trench metallization structures 69 and a dummy via trench metallization structure 220 are now formed. The via trench metallization structures 69 each include the first metallization trench 64 that includes the planarized back end liner 66, the planarized second copper seed layer 90 and is filled with the copper layer 92 (now referred to as a first metallization layer 68 including copper), and the via 62 that includes the planarized back end liner 66, the planarized second copper seed layer 90 and is filled with the copper layer 92 (now referred to as via contact 63 including copper). The dummy via trench metallization structure 220 includes the dummy first metallization trench 214 that includes the planarized back end liner 66, the planarized second copper seed layer 90 and is filled with the copper layer 92 (now referred to as a dummy first metallization layer 216 including copper), and the dummy via 212 that includes the planarized back end liner 66, the planarized second copper seed layer 90 and is filled with the copper layer 92 (now referred to as dummy via contact 218 including copper).

In addition, as a result of the above planarization process, the copper layer 92 grown to fill the upper channel passageway 80 now constitutes the second metal layer 28 of the MOL contact 24 that is located on top of a portion the first metal layer 26 with the second copper seed layer 90 and the first copper seed layer 32 located between the first metal layer 26 and the second metal layer 28 of the MOL contact 24, thereby completing the formation of the bilayer MOL contact 24 and forming the semiconductor structure 200 illustrated in FIG. 11.

In other words, the above-mentioned BEOL process of the present embodiment is used to form the first metallization layer 68 of the via trench metallization structure 69, the via contact 63 of the via trench metallization structure 69, the dummy first metallization layer 216 of the dummy via trench metallization structure 220, the dummy via 212 of the dummy via trench metallization structure 220, and is also used to complete the other half of metal bilayer of the MOL contact 24, thereby forming the semiconductor structure 200 illustrated in FIG. 11.

As discussed above, the dummy via contact 218 of the dummy via trench metallization structure 220 is not connected to circuitry and thus the dummy via trench metallization structure 220 is not active. In contrast, the via contacts 63 of the via trench metallization structures 69 are connected to circuitry and thus the via trench metallization structures 60 are electrically active.

Alternatively, and in other embodiments, a CVD copper method known in the art may be used to grow a metal layer 92 (e.g., copper layer) instead of the copper plating method to form the first metallization layer 68 of the via trench metallization structure 69, the via contact 63 of the via trench metallization structure 69, the dummy first metallization layer 216 of the dummy via trench metallization structure 220, the dummy via 212 of the dummy via trench metallization structure 220, and the second metal layer 28 of the MOL contact 24.

As noted above, in certain instances a dummy metallization structure 220 may be necessary to facilitate metallization at the BEOL stage when using a copper plating process for metallization at the BEOL stage. Namely, if a distance between a via 62 of one via trench metallization structures 69 to a via 62 of a closest next one of the via trench metallization structures 69 is expected to be significantly greater than a width of the opening of the bottom of the vias 62 of the via trench metallization structures 69 then the copper may not properly fill the upper channel passageway 80 in the MOL layer 20 for forming the second metal layer 28 of the MOL contact 24 and consequently it may be necessary to form a dummy via trench metallization structure 220 to facilitate metallization at the BEOL stage.

For example, set forth below is guideline Example 1 which may be applicable to the semiconductor structure 200 of the second embodiment for assisting one in determining if it may be necessary to form a dummy via trench metallization structure 220 between the via trench metallization structures 69. The below guideline Example 1 is by way of example only and is intended for illustration purposes only. Thus, exemplary embodiments of the present application are not limited thereto or thereby. Moreover, as would be readily understood by one of ordinary skill in the art viewing the present application, the numbers (e.g., distances and widths) provided below may be varied to suit a specific type of application.

In particular, according guideline Example 1, one who intended to use a copper plating process for metallization at the BEOL stage would provide at least one dummy via trench structure 210 if a distance ("z") between a via 62 of one of via trench metallization structures 69 to a via 62 of a next closest one of the via trench metallization structure 69 was expected to be about 3 times or more greater than a width ("x") of the openings of the bottom of the vias 62 of the via trench metallization structures 69.

For example, in the present guideline example, if z<3x, then no dummy via trench metallization structure 220 is needed. On the other hand, if z≥3x, then a dummy via trench metallization structure 220 may be need to be formed between the via trench metallization structures 69. For the sake of illustration only, in the present guideline example, z=8x and thus, a dummy via trench metallization structure 220 is formed in between the via trench metallization structures 69. Moreover, in the present guideline example, the dummy via trench structure 220 is formed between two of the via trench metallization structures 69 at a specific position and having a dummy via 212 with a bottom opening having a width of 2x (e.g., 2 times the width of the openings of the bottom of vias 62 of the via trench metallization structures 69) such that the dummy via 212 of the dummy via trench metallization structure 220 located between the two via trench metallization structures 69 is not spaced apart from the vias 62 of either of the two via trench metallization structures 69 by a distance of more than 3x.

As discussed, the above is only an example, and thus the distance between the vias 62 of the trench metallization structures 69 and the widths of the openings of the bottoms of the vias 62 of the via trench metallization structures 69, as well as the width of opening at the bottom of the dummy via 212 of the via trench metallization structure 220 may also be varied from the above mentioned distances and widths in a copper plating process depending upon the desired application.

Further, in addition to providing proper distances between vias 62 of via trench metallization structures 69 during a copper plating process to facilitate BEOL metallization, an additional general non-limiting guideline when using a copper plating during BEOL metallization is that the width and/or depth of the upper channel passageway 80 in which the second metal layer 28 of the MOL contact 24 is formed should be, for example, less than the width of each of the openings at the bottom of the vias 62 of the via trench metallization structures 69 to ensure that during metallization at the BEOL stage, the openings of vias 62 do not close before the entire upper channel passageway 80 is filled with copper but exemplary embodiments are not limited thereto.

Alternatively, as discussed, if a copper CVD process is being used instead of a copper plating process in the BEOL metallization steps then the use of a dummy via metallization structure 220 may not be necessary. However, similar to copper plating, also when using a copper CVD process, as a general non-limiting guideline, the width and/or depth of the upper channel passageway 80 in which the second metal layer 28 of the MOL contact 24 is formed should be, for example, less than the width of each of the openings at the bottom of the vias 62 of the via trench metallization structures 69 to ensure that during metallization at the BEOL stage, the openings of vias 62 do not close before the entire upper channel passageway 80 is filled with copper but exemplary embodiments are not limited thereto.

Figure 16:
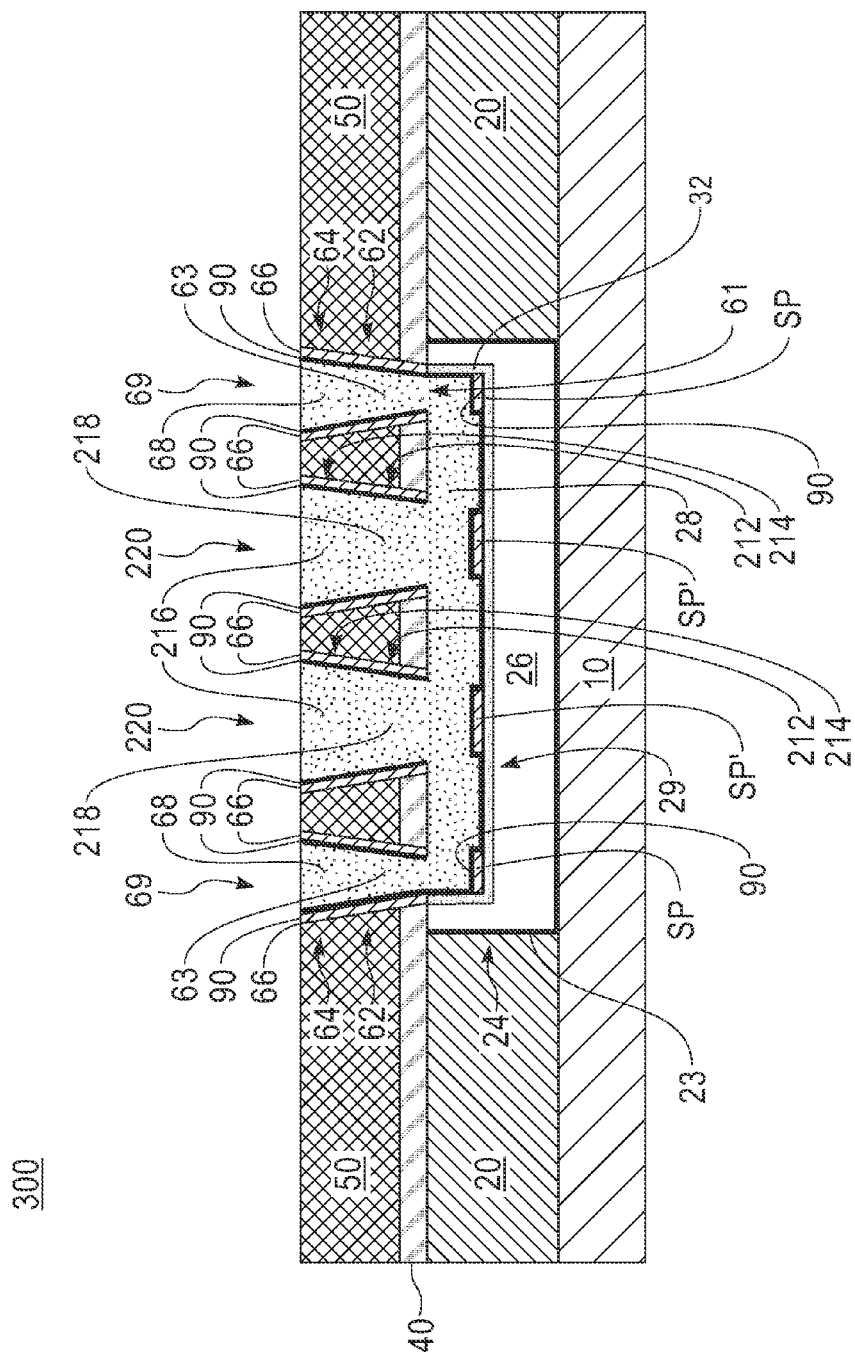
FIG. 16 is a vertical cross-sectional view of an exemplary semiconductor structure including a plurality of via trench metallization structures with a plurality of dummy via trench metallization structures located in between the plurality of via trench metallization structures according to a third embodiment of the present application.

Next, a semiconductor structure 300 in accordance with a third exemplary embodiment of the present application is illustrated in FIG. 16. The same reference numerals will be used in the present embodiment in the detailed description and the drawings to refer to the same elements in common with the first and second embodiments. Moreover, for the sake of brevity, elements of the first embodiment and second embodiment in common with the present embodiment will not be described. It is noted that the semiconductor structure 300 of the present embodiment is essentially the same as the semiconductor structure 200 of the second embodiment, except that the semiconductor structure 300 of the present embodiment further includes an additional dummy via trench metallization structure 220 formed between the via trench metallization structures 69 than in the second embodiment. As with the first one of the dummy via trench metallization structure 220 illustrated in the semiconductor structure 200 of FIG. 11 of the second embodiment, the additional dummy via trench metallization structure 220 in the present embodiment may also include a dummy first metallization trench 214 including a dummy first metallization layer 216 therein, and a dummy via 212 including a dummy via contact 218 therein.

The semiconductor structure 300 including the additional dummy via trench metallization structure 220 and all of its above-mentioned accompanying elements may be formed using essentially the same techniques, processes and materials used for forming semiconductor structure 200 formed in the second embodiment of the present application illustrated in FIG. 11 with the exception that in the present embodiment an extra dummy via trench metallization structure 220 is formed, as would be readily understood by one of ordinary skill in the art.

As set forth below is guideline example which may be applicable to the semiconductor structure 300 of the third embodiment for determining if it may be necessary to form a dummy via trench structure 210 between the via trench structures 60, and this guideline example, is termed as guideline Example 2. The below guideline example is for illustration purposes only and exemplary embodiments of the present application are not limited thereto or thereby. Moreover, as would be readily understood by one of ordinary skill in the art viewing the present application, the numbers provided below (e.g., widths of bottoms of openings of vias and dummy vias and distances between vias 62 and dummy vias 212) are simply for illustrative purposes and thus may be varied to suit a specific type of application.

In guideline Example 2, there are aspects similar to guideline Example 1 in that one who intended to use a copper plating process for metallization at the BEOL stage would provide at least one dummy via trench metallization structure 220 if a distance ("z") between a via 62 of one of via trench metallization structures 69 to a via 62 of a next closet one of the via trench metallization structures 69 was expected to be about 3 times or more greater than a width ("x") of the openings of the bottoms of the vias 62 of the via trench metallization structures 69. However, different from guideline Example 1, is that the distance from a via 62 of one of the via trench structures 60 to a via 62 of the next closest one of the via trench structures 60 is significantly greater in the present guideline example then in guideline Example 1.

For example, in the present guideline example, z=13× and thus, more than one dummy via trench metallization structure 220 is formed between the closest of two via trench metallization structures 69 such that there is no greater than 3× of spacing from a via (whether active 62 or dummy 212) to the next closet via (whether active 62 or dummy 212). Moreover, in the present guideline example, the dummy via trench metallization structures 220 each have dummy via 212 with a bottom opening having a width of 2× (e.g., 2 times the width of the opening of the bottom of vias 62 of the via trench metallization structures 69).

As discussed, the above is a non-limiting example for illustration purposes only, and the distance between the vias 62 of the trench metallization structures 69 and the widths of the openings of the bottoms of the vias 62 of the via trench metallization structures 69, as well as the width of opening at the bottom of the dummy via 212 of the via trench metallization structures 220 may also be varied from the above mentioned distances and widths in a copper plating process depending upon the desired application.

While the present application has been described in terms of specific embodiments, it is evident in view of the foregoing description that numerous alternatives, modifications and variations will be apparent to those skilled in the art. Each of the various embodiments of the present application can be implemented alone, or in combination with any other embodiments of the present application unless expressly disclosed otherwise or otherwise impossible as would be known to one of ordinary skill in the art. Accordingly, the present application is intended to encompass all such alternatives, modifications and variations which fall within the scope and spirit of the present application and the following claims.

What is claimed is:

1. A method of forming a semiconductor structure comprising:
    forming a first insulating layer containing a first metal layer embedded within an opening thereof and on a surface of a semiconductor substrate;
    forming an inter-layer dielectric (ILD) layer on the first insulating layer;
    forming at least one via trench structure in the ILD layer, wherein the at least one via trench includes a first metallization trench and a via;
    forming a copper seed layer over the ILD layer, within the first metallization trench and the via, and over the first metal layer; and
    depositing a metal material on the copper seed layer formed over the ILD layer to form a first metallization layer including a first portion of the metal material in the first metallization trench, a via contact including a second portion of the metal material in the via, and a second metal layer including a third portion of the metal material on top of at least a portion of the copper seed layer formed over the first metal layer in the opening of the first insulating layer, wherein the first metal layer and the second metal layer constitute a multilayer metal contact located in the opening of the first insulating layer.

2. The method of claim 1, wherein the second metal layer, the first metallization layer and the via contact each comprise copper, and wherein the first metal layer comprises one of cobalt (Co), tungsten (W), nickel (Ni), silver (Ag) or gold (Au), wherein there is no liner disposed at an interface between the multilayer metal contact and the via, and wherein only a small portion of a liner exists at a portion of an interface between the first metal layer and the second metal layer of the multilayer metal contact.

3. The method of claim 2, further comprising forming a first liner on upper surfaces of the first insulating layer, on inner sidewalls of the opening of the first insulating layer and on the portion of the upper surface of the semiconductor substrate exposed by the opening prior to forming the first metal layer in the opening of the first insulating layer.

4. The method of claim 3, wherein the first liner is a bilayer structure comprising one of titanium (Ti)/titanium nitride (TiN) or titanium (Ti)/tantalum nitride (TaN).

5. The method of claim 3, wherein prior to forming the ILD layer, the method further comprising:
    forming a further copper seed layer conformally along substantially the entire first metal layer;
    forming a sacrificial metal layer on the further copper seed layer in the opening of the first insulating layer; and
    performing a planarizing process on the first insulating layer such that upper surfaces of the first insulating layer, the first liner, the first metal layer, the further copper seed layer, and the sacrificial metal layer are all coplanar with each other.

6. The method of claim 5, wherein the forming of the at least one via trench structure comprises:
    forming a hard mask pattern on the ILD layer exposing a portion of an upper surface of the ILD layer; and
    etching the exposed portion of the upper surface of the ILD layer to form the via and the first metallization trench of the via trench structure in the ILD layer.

7. The method of claim 6, further comprising:
    removing the sacrificial metal layer and the hard mask pattern using an etching process thereby defining an upper channel passageway in the opening of the insulating layer which exposes the further copper seed layer, and wherein an opening of the upper channel passageway is connected to the at least on via trench structure through an opening in a bottom of the via of the at least one via trench structure.

8. The method of claim 7, further comprising:
forming a second liner along upper surfaces of the ILD layer and on inner sidewalls of the first metallization trench and the via;
forming the copper seed layer along substantially the entire second liner located on the inner sidewalls of the first metallization trench and the via, and on the further copper seed layer in the upper channel passageway;
growing the deposited metal material in the upper channel passageway located in the opening of the first insulating layer by using the copper seed layer and the further copper seed layer in the opening of the first insulating layer as a template to form the second metal layer on top of the at least the portion of the first metal layer with the copper seed layer and the further copper seed layer therebetween in the opening of the first insulating layer; and
growing the deposited metal material by using the copper seed layer located on the inner sidewalls of the first metallization trench and the inner sidewalls of the via of the at least one via trench structure as a template to form the first metallization layer in the first metallization trench and the via contact in the via.

9. The method of claim 8, wherein the deposited metal material is copper, the method further comprising:
performing a chemical mechanical planarization (CMP) process on the ILD layer such that an upper surface of the first metallization layer formed in the first metallization trench of the at least one via trench structure is coplanar with the upper surface of the ILD layer.

10. The method of claim 2, wherein the second metal layer, the first metallization layer and the via contact are all formed simultaneously using a same copper plating process.

11. The method of claim 2, wherein the second metal layer, the first metallization layer, and the via contact are all formed simultaneously using a same chemical vapor deposition process (CVD) copper process.

12. A method for forming a semiconductor device comprising:
forming a middle-of-the-line (MOL) dielectric layer on a portion of a semiconductor substrate that includes semiconductor devices;
forming an opening in the MOL dielectric layer that exposes a portion of the semiconductor substrate that includes the semiconductor devices;
forming a MOL liner on inner sidewalls of the MOL dielectric layer in the opening and on the portion of the semiconductor substrate exposed by the opening in the MOL dielectric layer;
forming a first metal material layer conformally along the MOL liner to partially fill the opening in the MOL dielectric layer;
forming a second metal material layer on the first metal material layer to fill the opening in the MOL dielectric layer;
performing a planarization process on the MOL dielectric layer, the MOL liner, the first metal material layer, and the second metal material layer such that upper surfaces of the MOL dielectric layer, the MOL liner, a first metal layer formed from the planarizing of the first metal material layer, and the second metal material layer are now all coplanar with each other;
performing a back end of line process (BEOL) on the planarized MOL dielectric layer, wherein the BEOL process comprises:
depositing a low-k dielectric inter-layer dielectric (ILD layer) over the planarized MOL dielectric layer;
etching the low-k ILD layer to form a plurality of via trench structures in the low-k ILD layer, wherein each of the via trench structures includes a first metallization trench and a via;
removing the second metal material layer to form an upper channel passageway in the opening of the MOL on top of at least a portion of the first metal layer; and
forming an MOL contact and a plurality of via trench metallization structures by forming a copper layer from deposited copper in the upper channel passageway in the opening of the MOL dielectric layer and in the via and the first metallization trench of the via trench structures, thereby forming a second metal layer including a first portion of the copper in the upper channel passageway on top of the at least the portion of the first metal layer, a first metallization layer including a second portion of the copper in the first metallization trenches and a via contact including a third portion of the copper in the vias, wherein the first metal layer and second metal layer constitute the MOL contact and wherein the first metal layer includes a different metal than copper.

13. The method of claim 12, further comprising:
forming a first copper seed layer conformally on the first metal material layer prior to forming the second metal material layer;
depositing a low-k barrier layer on the MOL layer and the second metal material layer prior to depositing the low-k ILD layer;
depositing a hard mask layer on the low-k ILD layer;
patterning the hard mask layer to form a patterned hard mask to thereby expose at least two portions of an upper surface of the ILD layer;
etching the ILD layer and the low-k barrier layer using the patterned hard mask as an etching mask in a dual damascene process to form the plurality of via trench structures, wherein the first metallization trench of each of the via trench structures is located in an upper portion of the low-k ILD layer and the via of each of the via trench structures is located in a lower portion of the low-k ILD layer and extends downwardly and completely through the low-k barrier layer;
forming a second copper seed layer on inner sidewalls of the via and on inner sidewalls of the first metallization trench of each of the via trench structures and in the upper channel passageway on the first copper seed layer; and
growing the deposited copper in the first metallization trenches and the vias using the second copper seed layer as a template and in the upper channel passageway using the first seed layer and the second seed layer as a template to form the first metallization layer in the first metallization trench and the via contact in the via of each of the via trench structures, thereby forming the plurality of via trench metallization structures, and further forming the second metal layer of MOL contact filling the upper channel passageway in the MOL opening.

14. The method of claim 13, wherein the first metallization layers, the via contacts and the second metal layer of MOL contact are each formed together by a copper plating method during the BEOL process, and wherein with the copper plating method, the deposited copper is grown upward from the first and second copper seed layers in the upper channel passageway to fill the upper channel passageway to form the second metal layer therein, is grown sideways from the second copper seed layer on the inner sidewalls of the first metallization trenches to form the first metallization layer in each of the first metallization trenches and the deposited copper is also grown sideways from the second copper seed layer on the inner sidewalls of the via to form a via contact in each of the vias.

15. The method of claim 14, wherein portions of the deposited copper that are overgrown above the first metallization trenches and on upper surfaces of the low-k ILD layer are then planarized using a chemical mechanical polishing (CMP) process such that upper surfaces of the first metallization layers are coplanar with an upper surface of the low-k ILD layer, an upper surface of the back end liner, and an upper surface of the second copper seed layer.

16. The method of claim 12, further comprising:
forming a back end liner on inner sidewalls of the first metallization trench an on inner sidewalls of the via of the via trench structures, wherein the first metal layer comprises one of cobalt, tungsten, nickel, silver, or gold, wherein there is no liner disposed at a first interface between the MOL contact and the vias of the via trench metallization structures, and wherein only a small portion of the back end liner exists at portions of a second interface located between the first metal layer and the second metal layer of the MOL contact.

17. The method of claim 12, wherein the first metallization layers, the via contacts and the second metal layer of MOL contact are each formed together by a same CVD copper method during the BEOL process.

18. The method of claim 12, further comprising forming at least one dummy via trench metallization structure in the low-k ILD layer and in between the plurality of via trench metallization structures during the BEOL process used to form the plurality of via trench metallization structures.

* * * * *